United States Patent
Kato et al.

(10) Patent No.: US 9,431,412 B1
(45) Date of Patent: Aug. 30, 2016

(54) SEMICONDUCTOR MEMORY DEVICE AND METHOD FOR MANUFACTURING THE SAME

(71) Applicant: KABUSHIKI KAISHA TOSHIBA, Minato-ku (JP)

(72) Inventors: Tatsuya Kato, Yokkaichi Mie (JP); Fumitaka Arai, Yokkaichi Mie (JP); Satoshi Nagashima, Yokkaichi Mie (JP); Katsuyuki Sekine, Yokkaichi Mie (JP); Yuta Watanabe, Yokkaichi Mie (JP); Keisuke Kikutani, Yokkaichi Mie (JP); Atsushi Murakoshi, Yokkaichi Mie (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/847,921

(22) Filed: Sep. 8, 2015

Related U.S. Application Data

(60) Provisional application No. 62/188,926, filed on Jul. 6, 2015.

(51) Int. Cl.
  *H01L 21/336* (2006.01)
  *H01L 27/115* (2006.01)

(52) U.S. Cl.
  CPC ... *H01L 27/11556* (2013.01); *H01L 27/11521* (2013.01)

(58) Field of Classification Search
  None
  See application file for complete search history.

(56) References Cited

U.S. PATENT DOCUMENTS

| | | | |
|---|---|---|---|
| 8,921,918 B2 | 12/2014 | Shim et al. | |
| 8,941,172 B2 | 1/2015 | Yoo | |
| 8,946,665 B2 | 2/2015 | Shim et al. | |
| 9,012,971 B2 | 4/2015 | Seo et al. | |
| 2012/0098050 A1 | 4/2012 | Shim et al. | |
| 2012/0235220 A1 | 9/2012 | Sekine et al. | |
| 2013/0009235 A1 | 1/2013 | Yoo | |
| 2014/0014889 A1* | 1/2014 | Shim | H01L 29/7827 257/1 |
| 2014/0131785 A1 | 5/2014 | Seo et al. | |
| 2014/0264547 A1 | 9/2014 | Kawai et al. | |
| 2015/0200199 A1 | 7/2015 | Sakamoto et al. | |

FOREIGN PATENT DOCUMENTS

| | | |
|---|---|---|
| JP | 2010-225694 A | 10/2010 |
| JP | 2012-94869 A | 5/2012 |
| JP | 2012-195344 A | 10/2012 |
| JP | 2013-21322 A | 1/2013 |
| JP | 2014-22729 A | 2/2014 |
| JP | 2014-96466 A | 5/2014 |
| JP | 2014-179465 A | 9/2014 |

* cited by examiner

*Primary Examiner* — Thomas L Dickey
*Assistant Examiner* — Shaka White
(74) *Attorney, Agent, or Firm* — Oblon, McClelland, Maier & Neustadt, L.L.P.

(57) ABSTRACT

According to one embodiment, a semiconductor memory device includes a first array extending in a first direction, a second array extending in the first direction, and a second electrode film. The second array is arranged with the first array in a second direction crossing the first direction. The second electrode film provided between the first array and the second array. The second electrode film extends in the first direction. Each of the first array and the second array include a first structure, a second structure arranged in the first direction, a fourth insulating film provided between the first structure and the second structure, and a third insulating film provided between the first structure and the second electrode film, provided also between the first structure and the fourth insulating film.

17 Claims, 41 Drawing Sheets

US 9,431,412 B1

SEMICONDUCTOR MEMORY DEVICE AND METHOD FOR MANUFACTURING THE SAME

CROSS-REFERENCE TO RELATED APPLICATIONS

This application is based upon and claims the benefit of priority from U.S. provisional patent application 62/188,926, filed on Jul. 6, 2015; the entire contents of which are incorporated herein by reference.

FIELD

Embodiments relate to a semiconductor device and a method for manufacturing the same.

BACKGROUND

In the past, there has been proposed a stacked semiconductor memory device having a stacked body formed of insulating films and electrode films stacked alternately, and semiconductor pillars penetrating the stacked body. In the stacked semiconductor memory device, a memory cell is formed in every part where the semiconductor pillar and the electrode film intersect with each other. In such a stacked semiconductor memory device as described above, it is desirable to shorten the distance between the semiconductor pillars to incorporate a larger number of memory cells to thereby achieve high integration.

BRIEF DESCRIPTION OF THE DRAWINGS

FIGS. 8 and 9 are cross-sectional views showing the area F shown in FIG. 7;

FIG. 11 is a cross-sectional view showing the area F shown in FIG. 7;

FIG. 13 is a cross-sectional view along the line H-H' shown in FIG. 12;

FIGS. 14 and 15 are cross-sectional views along the line I-I' shown in FIG. 12;

FIG. 17 is a cross-sectional view along the line H-H' shown in FIG. 16;

FIG. 18 is a cross-sectional view along the line I-I' shown in FIG. 12;

FIGS. 19 to 21 are cross-sectional views showing the area F shown in FIG. 7;

FIGS. 22 and 23 are cross-sectional views along the line I-I' shown in FIG. 12;

FIG. 26 is a cross-sectional view along the line I-I' shown in FIG. 25;

FIG. 32 is a cross-sectional views along the line I-I' shown in FIG. 31;

FIG. 33 is a cross-sectional views showing the area F shown in FIG. 31;

FIG. 34 is a cross-sectional views along the line I-I' shown in FIG. 31;

FIG. 35 is a cross-sectional view showing the area F shown in FIG. 31;

FIG. 37 is a cross-sectional views along the line I-I' shown in FIG. 31;

FIG. 38 is a cross-sectional views along the line I-I' shown in FIG. 31;

DETAILED DESCRIPTION

Figure 1:
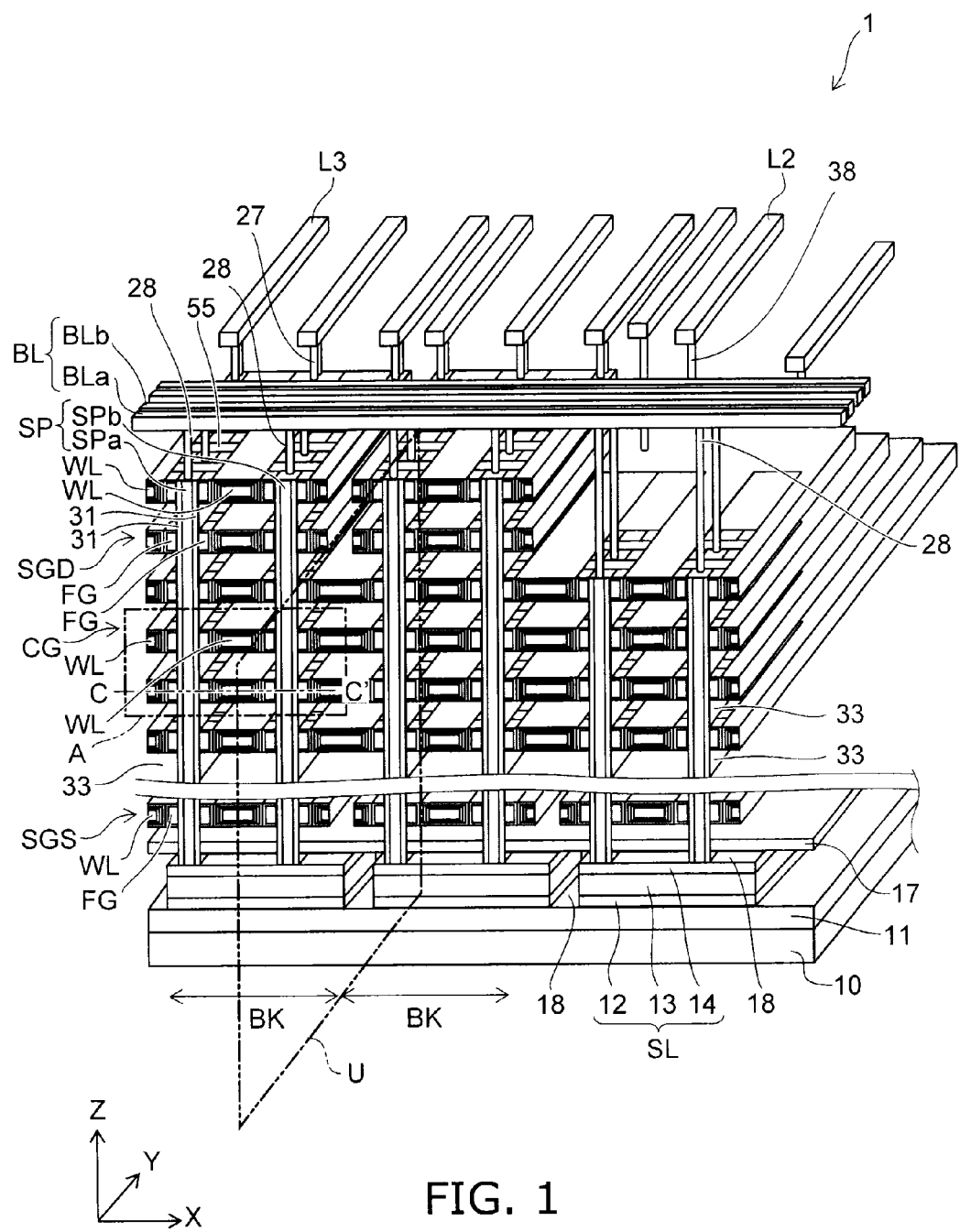
FIG. 1 is a perspective view showing an example of the semiconductor memory device according to a first embodiment.

According to one embodiment, a semiconductor memory device includes a first array extending in a first direction, a second array extending in the first direction, and a second electrode film. The second array is arranged with the first array in a second direction crossing the first direction. The second electrode film provided between the first array and the second array. The second electrode film extends in the first direction. Each of the first array and the second array include a first structure, a second structure arranged in the first direction, a fourth insulating film provided between the first structure and the second structure, and a third insulating film provided between the first structure and the second electrode film, provided also between the first structure and the fourth insulating film. The fifth insulating film is provided between the second structure and the second electrode film. The fifth insulating film is provided also between the second structure and the fourth insulating film. The first structure includes a semiconductor pillar, a first insulating film, a first electrode film, and a second insulating film. The semiconductor pillar extends in a third direction crossing the first direction and the second direction. In the second direction of the first structure, the first insulating film is provided between the semiconductor pillar of the first structure and the third insulating film. In the second direction of the first structure, the first electrode film is provided between the first insulating film of the first structure and the third insulating film. In the first direction of the first structure, the second insulating film is provided between the semiconductor pillar of the first structure and the third insulating film. The second structure includes a semiconductor pillar, a first insulating film, a first electrode film, and a second insulating film. The semiconductor pillar extends in the third direction. In the second direction of the second structure, the first insulating film is provided between the semiconductor pillar of the second structure and the fifth insulating film. In the second direction of the second structure, the first electrode film is provided between the first insulating film of the second structure and the fifth insulating film. In the first direction of the second structure, the second insulating film is provided between the semiconductor pillar of the second structure and the fifth insulating film.

According to one embodiment, a method of manufacturing a semiconductor memory device includes forming a stacked body by alternately stacking first insulating films and filling films in a first direction, forming a trench shaped like a trench penetrating the stacked body in the first direction. The trench is provided in a second direction different from the first direction. The method of manufacturing a semiconductor memory device also includes forming a first recess by removing a part of the filling film via the trench. The part is located on the trench side. The method of manufacturing a semiconductor memory device also includes forming a second insulating film on an inner surface of the first recess, forming a first electrode film in the first recess, forming a third insulating film on a surface of the first electrode film, and forming a semiconductor body by filling the trench with a semiconductor material. The method of manufacturing a semiconductor memory device also includes forming a plurality of semiconductor pillars by forming a first insulating member penetrates the semiconductor body in the first direction to divide the semiconductor body in the second direction. The method of manufacturing a semiconductor memory device also includes dividing the third insulating film, the first electrode film, and the second insulating film in the second direction for each of the semiconductor pillars. The method of manufacturing a semiconductor memory device also includes forming a through hole by dividing the first insulating member in the second direction. The method of manufacturing a semiconductor memory device also includes exposing a surface of the second insulating film by forming a hollow section by removing the filling film via the through hole. The method of manufacturing a semiconductor memory device also includes forming a second electrode film in the hollow section via the through hole. The method of manufacturing a semiconductor memory device also includes forming the second insulating member by removing the second electrode film in the through hole and filling the through hole with an insulating material.

Hereinafter, some embodiments of the invention will be explained with reference to the accompanying drawings.

First Embodiment

A configuration of a semiconductor memory device according to an embodiment of the invention will be explained.

FIG. 1 is a perspective view showing an example of the semiconductor memory device according to the embodiment.

As shown in FIG. 1, in the semiconductor memory device 1 according to the embodiment, there is disposed a silicon substrate 10, and an insulating film 11 is disposed on the silicon substrate 10.

Hereinafter, in the specification, for the sake of convenience of explanation, there is adopted an XYZ Cartesian coordinate system. For example, two directions, which are parallel to a contact surface between the silicon substrate 10 and the insulating film 11, and are perpendicular to each other, are defined as an "X-direction" and a "Y-direction." An opposite direction to the X-direction is defined as a "−X-direction," and an opposite direction to the Y-direction is defined as a "−Y-direction." A direction, which is perpendicular to the contact surface between the silicon substrate 10 and the insulating film 11, and toward the insulating film 11, is defined as a "Z-direction." An opposite direction to the Z-direction is defined as a "−Z-direction."

On the insulating film 11, there are disposed source lines SL extending in the Y-direction and separated in the X-direction from each other. The source lines SL are each formed of an electrically conductive layer 12, a wiring layer 13 disposed on the electrically conductive layer 12, and an electrically conductive layer 14 disposed on the wiring layer 13. On the source lines SL, there is disposed an insulating film 17. An insulating member 18 is disposed between the source lines SL, and between the source line SL and the insulating film 17.

On each of the source lines SL, there are disposed silicon pillars SP extending in the Z-direction and separated in the Y-direction from each other. The silicon pillars SP are each formed of, for example, amorphous silicon (a-Si), and the lower end of the silicon pillar SP penetrates the insulating film 17, and is connected to the source line SL. When viewed from the Z-direction, the silicon pillars SP are arranged in a matrix along the X-direction and the Y-direction. On each of the side surface of the silicon pillar SP facing to the X-direction and the side surface thereof facing to the −X-direction, there is disposed a tunnel insulating film 31.

On the side surface of the tunnel insulating film 31, on which the silicon pillar SP is not disposed, there is disposed a plurality of electrode films separated from each other along the Z-direction. The electrode films are each referred to as a floating gate electrode FG. On the side surfaces of the floating gate electrodes FG, on which the silicon pillar SP is not disposed, there are respectively disposed word lines WL, which extend in the Y-direction, via respective insulating films. Between the two silicon pillars SP arranged along the Y-direction, there is disposed an insulating member 55, but the word lines WL and the floating gate electrodes FG are not disposed. Therefore, the floating gate electrode FG disposed on the X-direction side of the silicon pillar SP and the floating gate electrode FG disposed on an opposite side in the X-direction of the silicon pillar SP are not connected to each other.

Between the source lines SL and the plurality of word lines WL, a plurality of selecting gate lines, which are the same in the position in the Z-direction as each other, extends in the Y-direction. These selecting gate lines are each referred to as a source-side selecting gate electrode SGS. On an end portion in the Y-direction of the source-side selecting gate electrode SGS, there is disposed a contact 37 (not shown), and on the contact 37, there is disposed a wiring line L1 (not shown) extending in the Y-direction. The wiring line L1 is connected to the source-side selecting gate electrode SGS via the contact 37.

The word lines WL, which are disposed on the source-side selecting gate electrode SGS via the insulating film 33, and are the same in the position in the Z-direction as each other, each extend in the Y-direction, and are bundled at the destination of the extension. The word lines WL thus bundled are referred to as a control gate electrode CG. On an end portion in the Y-direction of each of the control gate electrodes CG, there is disposed a contact 38. On the contacts 38, there are disposed wiling lines L2 extending in the Y-direction and separated in the X-direction from each other. The wiring line L2 is connected to the control gate electrode CG via the contact 38.

In an area located in the Z-direction from the plurality of word lines WL, selecting gate lines, which are the same in the position in the Z-direction as each other, each extend in the Y-direction. These selecting gate lines are each referred to as a drain-side selecting gate electrode SGD. On an end portion in the Y-direction of each of the drain-side selecting gate electrodes SGD, there is disposed a contact 27. On the contacts 27, there are disposed wiling lines L3 extending in the Y-direction and separated in the X-direction from each other. The wiring line L3 is connected to the drain-side selecting gate electrode SGD via the contact 27.

On the silicon pillars SP, there are disposed contacts 28 extending in the Z-direction, and on the contacts 28, there are disposed bit lines BL extending in the X-direction and separated in the Y-direction. In the case in which the silicon pillar SP disposed at the end in the −X-direction out of the plurality of silicon pillars SP arranged along the X-direction is defined as the first silicon pillar SP, the odd-numbered silicon pillars SPa are connected to a common bit line BLa via the respective contacts 28. The even-numbered silicon pillars SPb are connected to a common bit line BLb different from the bit line BLa via the respective contacts 28. The silicon pillars SPa, SPb adjacent to each other out of the plurality of silicon pillars SP arranged along the X-direction are not connected to a common bit line.

The silicon pillar SPa and the silicon pillar SPb adjacent to each other in the X-direction are connected to the common source line SL. The silicon pillar SPa, the silicon pillar SPb, and the source line SL constitute a single block BK. A plurality of blocks BK is arranged in the X-direction.

Figure 2:
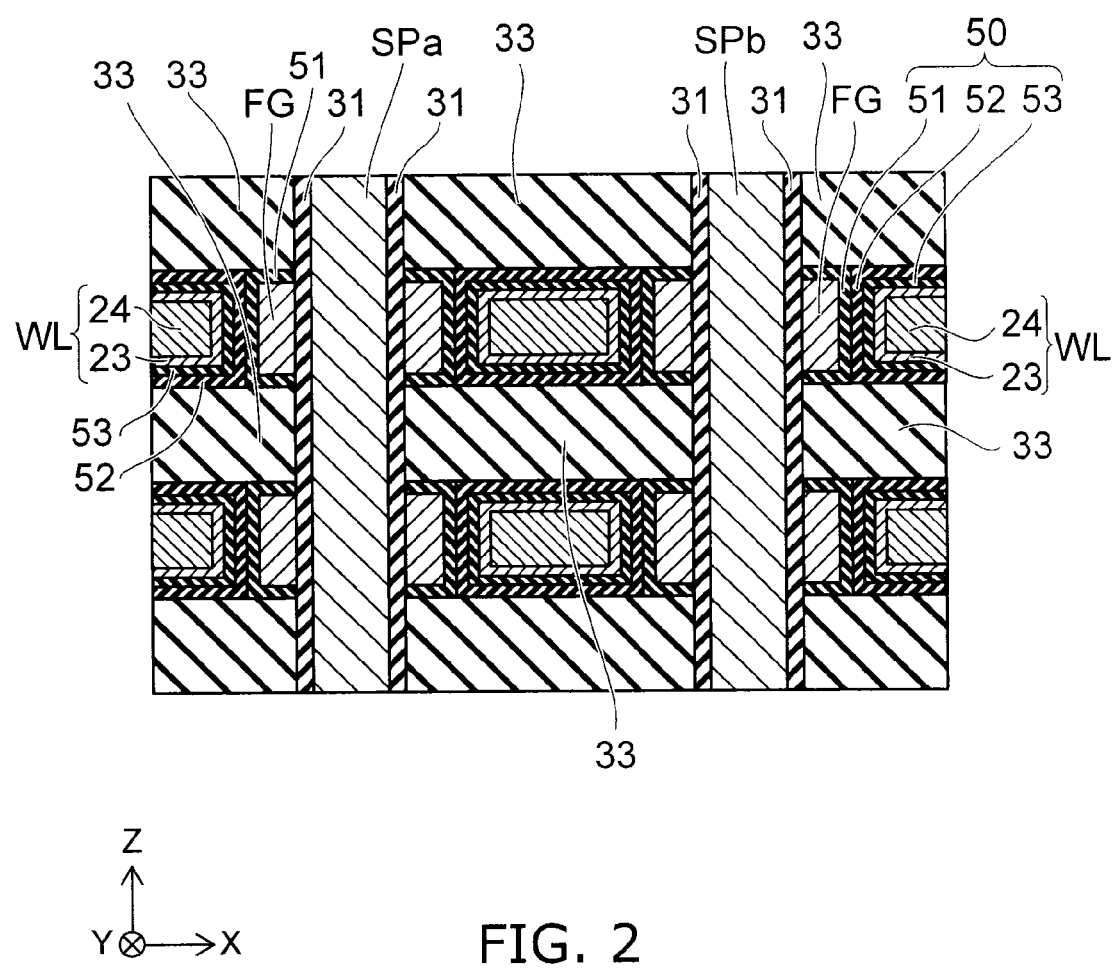
FIG. 2 is a cross-sectional view showing an example of the area A shown in FIG. 1.

FIG. 2 is a cross-sectional view showing an example of the area A shown in FIG. 1.

As shown in FIG. 2, on the side surface of the tunnel insulating film 31, on which the silicon pillar SPa is not disposed, the layers each formed of the floating gate electrode FG, block insulating films 51, 52, and 53, and the word line WL, and the insulating films 33 are disposed alternately along the Z-direction. On the side surface of the floating gate electrode FG, on which the silicon pillar SPa is not disposed, and between the upper and lower surfaces in the Z-direction of the floating gate electrode FG and the insulating films 33, there is disposed the block insulating film 51. On the side surface of the block insulating film 51, on which the silicon pillar SPa is not disposed, and between the insulating films 33 located on both sides in the Z-direction, there is disposed the word line WL via the block insulating films 52, 53.

The word line WL is formed of an electrically conductive member 24 covered with a barrier metal film 23.

A stacked film formed of the block insulating films 51, 52, and 53 is referred to as a block insulating film 50. The block insulating film 50 is a film substantially preventing a current from flowing even in the case in which a voltage is applied within a range of the drive voltage of the semiconductor memory device 1. The floating gate electrode FG is a film capable of storing the charge. The tunnel insulating film 31 is a film, which has an insulating property in a normal state, and allows the tunnel current to flow when a predetermined voltage within the range of the drive voltage of the semiconductor memory device 1 is applied. The barrier metal film 23 is a film for preventing the electrically conductive material of the electrically conductive member 24 from spreading.

Figure 3:
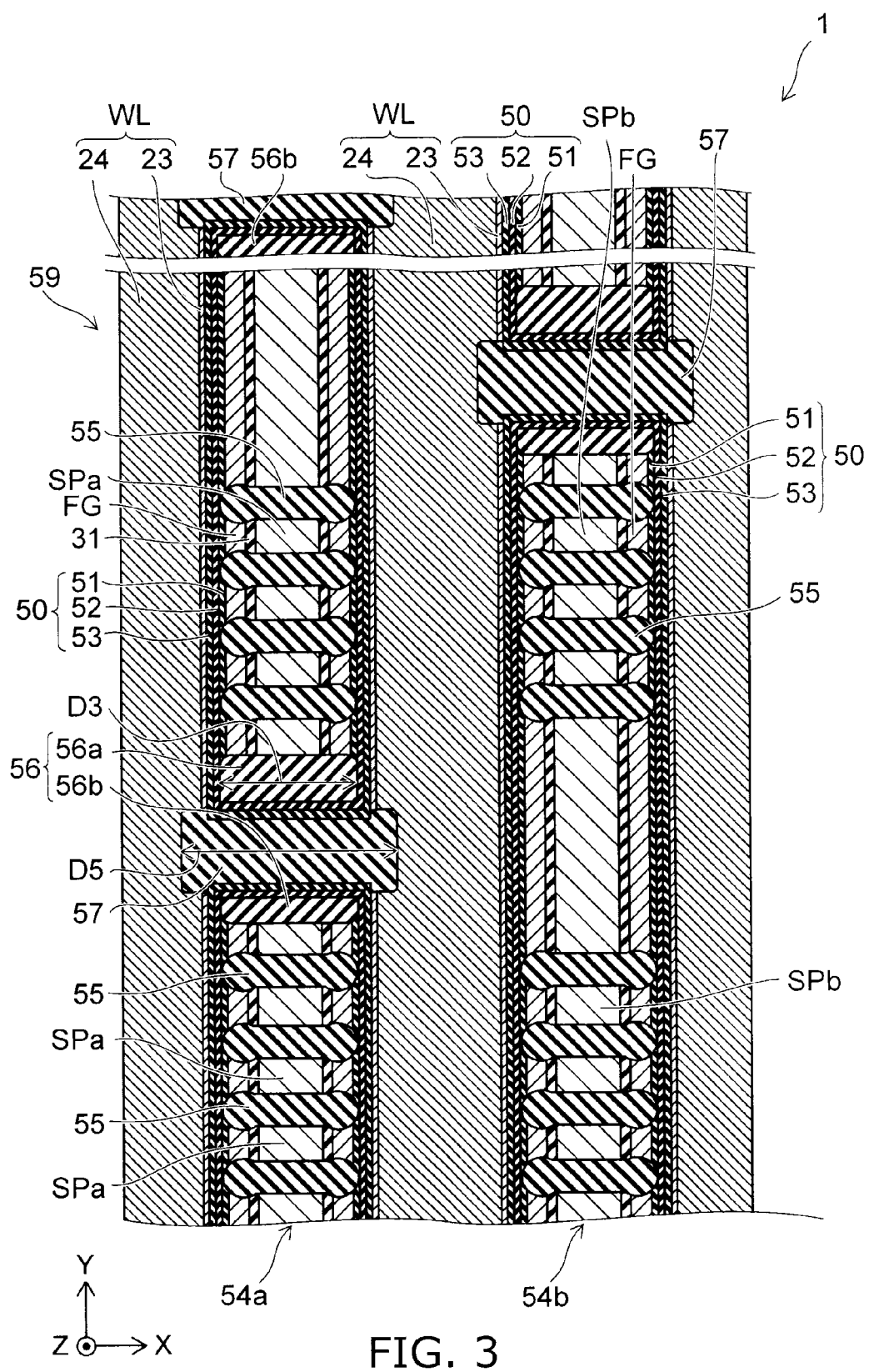
FIG. 3 is a cross-sectional view along the line C-C' shown in FIG. 1.

FIG. 3 is a cross-sectional view along the line C-C' shown in FIG. 1.

As shown in FIG. 3, when viewed from the Z-direction, the silicon pillar SPa has a roughly rectangular shape, and between the two silicon pillars SPa arranged along the Y-direction, there is disposed an insulating member 55 or an insulating member 56. The tunnel insulating film 31, the floating gate electrode FG, and the block insulating film 51 are disposed between the silicon pillar SPa and the word line WL in this order from the side provided with the silicon pillar SPa, and are divided along the Y-direction by the insulating members 55 and the insulating members 56.

The tunnel insulating film 31, the floating gate electrode FG, and the block insulating film 51 are disposed at every intersection between the silicon pillar SPa and the word line WL, and therefore, the sets of the tunnel insulating film 31, the floating gate electrode FG, and the block insulating film 51 are arranged in a matrix so as to be separated from each other along the Y-direction and the Z-direction. When viewed from the Z-direction, the floating gate electrode FG has a fan-like shape flared in the part located on the word line WL side.

When viewed from the Z-direction, on the side of the tunnel insulating film 31 on which the silicon pillar SPa is not disposed, there is disposed the block insulating film 52, and on the side of the block insulating film 52 on which the silicon pillar SPa is not disposed, there is disposed the block insulating film 53. On the side of the block insulating film 53 on which the silicon pillar SPa is not disposed, there is disposed the barrier metal film 23.

A structure including the silicon pillars SPa, the tunnel insulating films 31, the floating gate electrodes FG, the insulating members 55, an insulating member 56a, and an insulating member 56b is referred to as a structure 59. When viewed from the Z-direction, the structure 59 is surrounded by the block insulating films 52, 53. In the Y-direction, the insulating member 56b is disposed in an end portion of the structure 59, and in the −Y-direction, the insulating member 56a is disposed in an end portion of the structure 59. Between the insulating member 56a and the insulating member 56b in the structure 59, there are disposed the insulating members 55 so as to be separated from the insulating members 56a, 56b.

Between the two structures 59 arranged in the Y-direction, there are disposed insulating members 57 extending in the Z-direction. As described later, the insulating member 56 is divided by the insulating member 57 into two parts, and the two parts correspond respectively to the insulating member 56a and the insulating member 56b described above.

An arrangement in the Y-direction including the structures 59 including the silicon pillars SPa, the block insulating films 50, and the insulating members 57 is referred to as an array 54a. An arrangement in the Y-direction including the structures 59 including the silicon pillars SPb, the block insulating films 50, and the insulating members 57 is referred to as an array 54b. The array 54a and the array 54b are arranged in the X-direction via the word line WL. The insulating member 57 of the array 54b is not disposed in a part located across the word line WL from the insulating member 57 of the array 54a.

The number of the insulating members 57 is smaller than the number of the insulating members 55, and the insulating member 57 is disposed every two or more insulating members 55 in a periodic manner.

In the X-direction, the length D3 of the insulating member 56 is shorter than the length D5 of the insulating member 57.

An example of the materials of the respective constituents will hereinafter be described.

The silicon substrate 10 is formed of, for example, a semiconductor material including silicon (Si). The insulating member 18 is formed of, for example, silicon oxide ($SiO_2$). The wiring lines L1, L2, and L3, and the bit line BL are formed of, for example, tungsten (W). The tunnel insulating film 31 is formed of, for example, a silicon oxide. The block insulating film 51 is formed of, for example, silicon nitride (SiN) and a High-k material such as hafnium oxide (HfO). Further, the block insulating film 51 can also be formed of a material including metal such as ruthenium (Ru). The block insulating film 52 is formed of, for example, silicon oxide. The block insulating film 53 is sufficiently formed of a material high in permittivity, and is formed of, for example, a High-k film such as an oxide film including hafnium (Hf), zirconium (Zr), or the like. Further, the block insulating film 53 can also be formed of silicon nitride. The barrier metal film 23 is formed of, for example, titanium nitride (TiN). The electrically conductive member 24 is formed of, for example, tungsten.

A method of manufacturing the semiconductor memory device according to the embodiment will be explained.

FIGS. 4A through 25 are cross-sectional views showing an example of the method of manufacturing the semiconductor memory device according to the embodiment.

Figure 7:
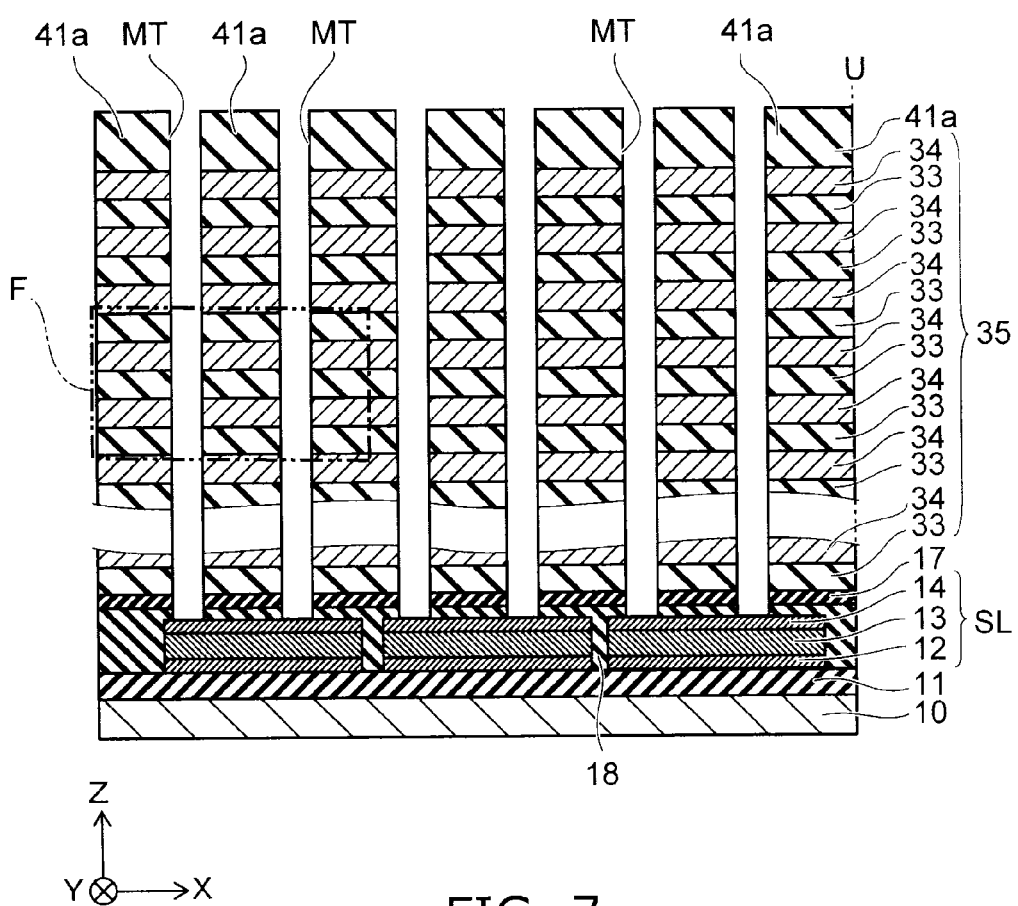

FIGS. 8, 9, 11, 19, 20, and 21 are cross-sectional views showing the area F shown in FIG. 7.

Figure 12:
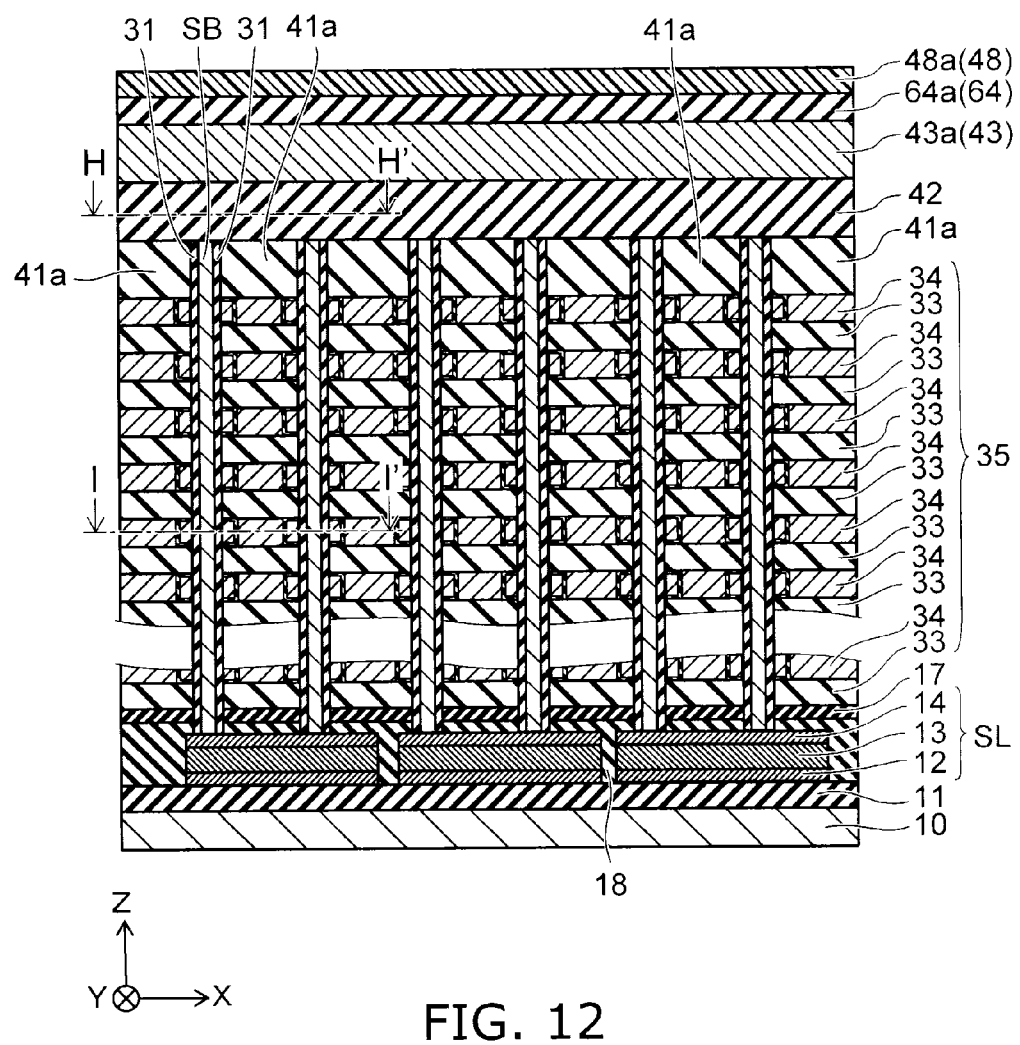
FIG. 12 is a cross-sectional view showing an example of the method of manufacturing the semiconductor memory device according to the first embodiment.
Figure 13:
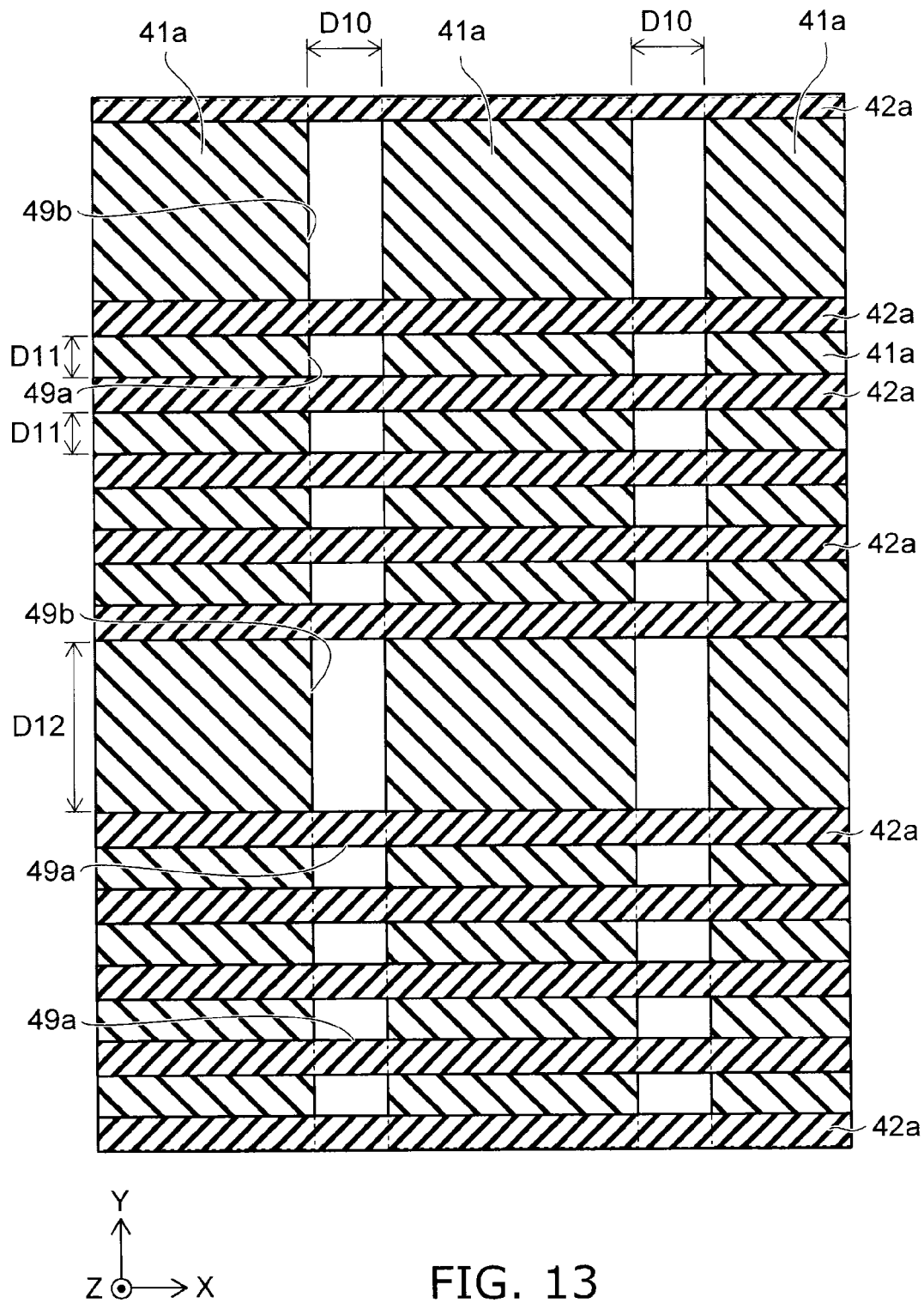
FIG. 13 is a cross-sectional view showing an example of the method of manufacturing the semiconductor memory device according to the first embodiment.

FIG. 13 is a cross-sectional view along the line H-H' shown in FIG. 12.

FIGS. 14, 15, 18, 22, and 23 are cross-sectional views along the line I-I' shown in FIG. 12.

Figure 16:
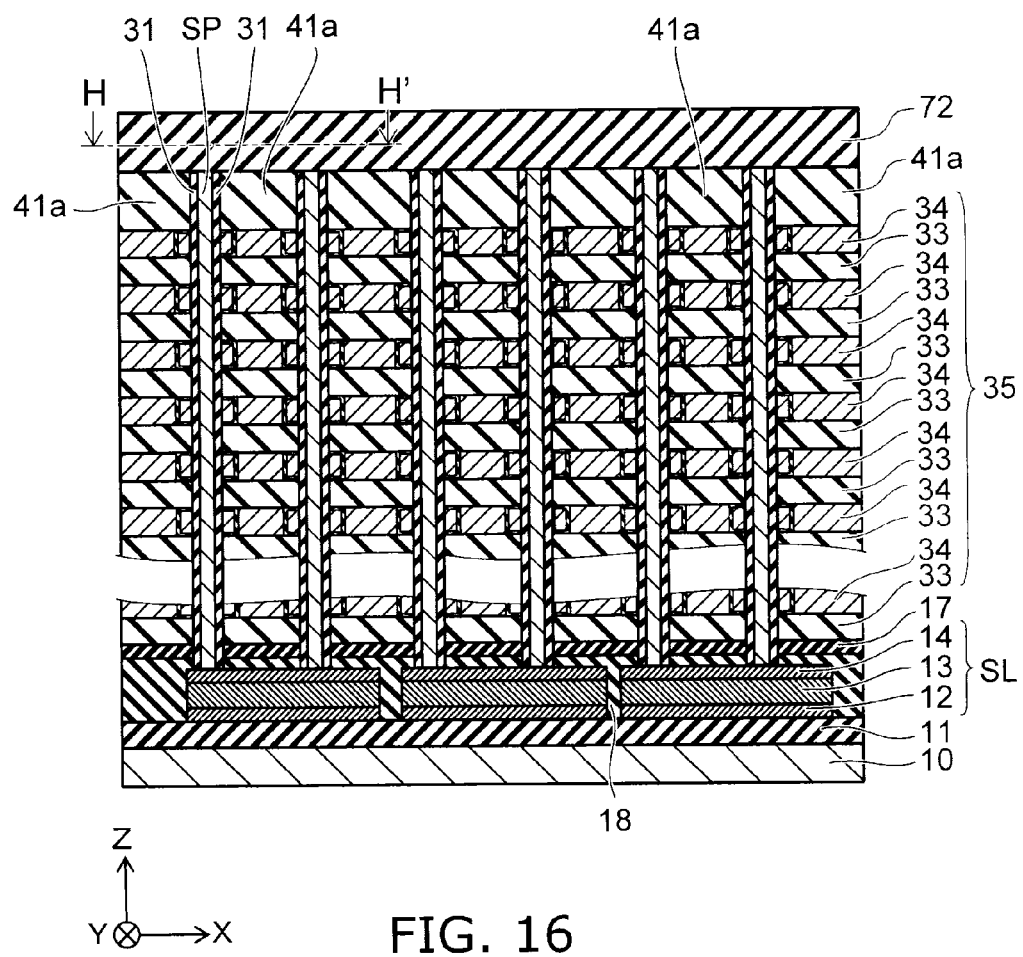
FIG. 16 is a cross-sectional view showing an example of the method of manufacturing the semiconductor memory device according to the first embodiment.
Figure 17:
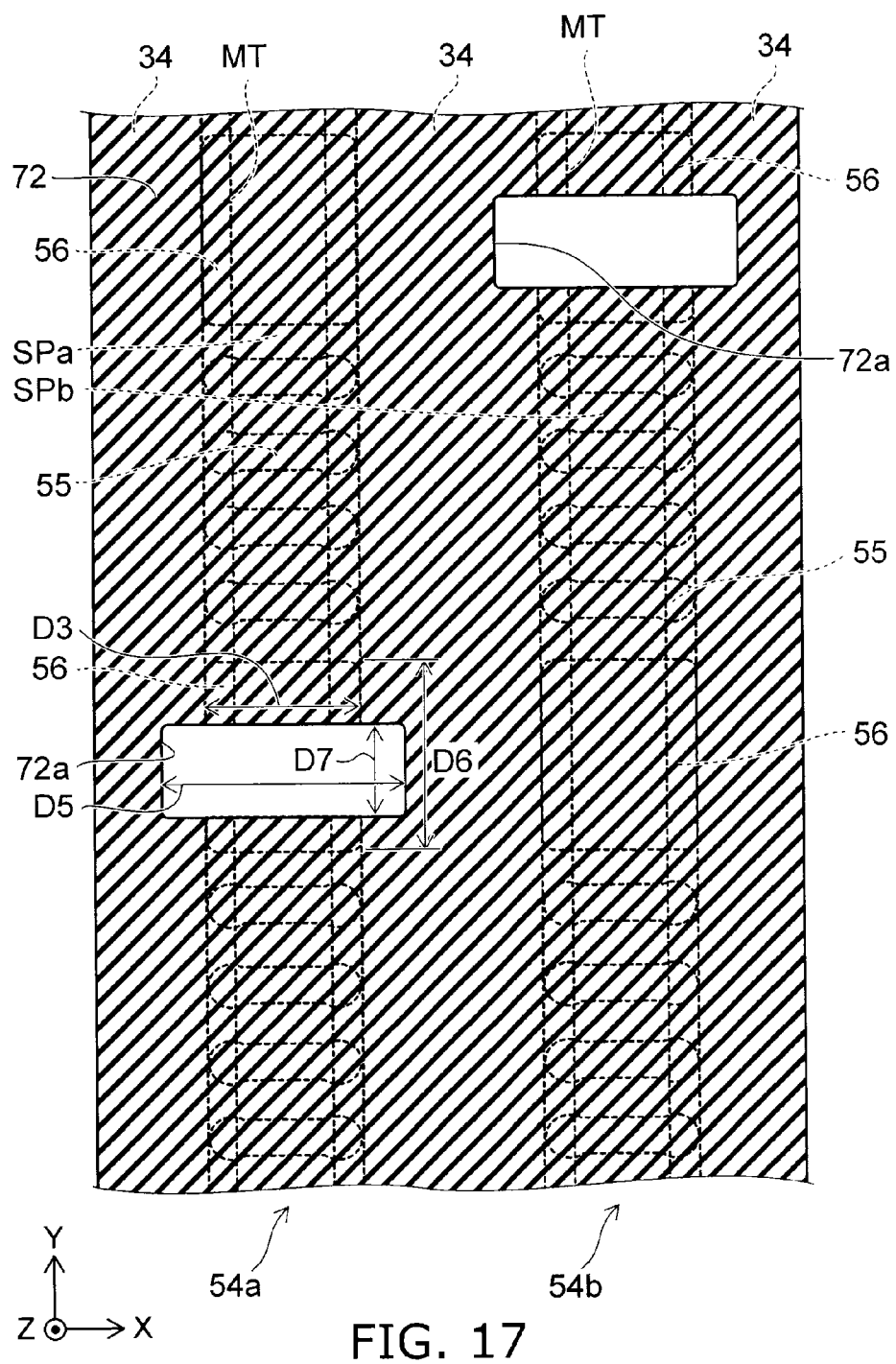
FIG. 17 is a cross-sectional view showing an example of the method of manufacturing the semiconductor memory device according to the first embodiment.

FIG. 17 is a cross-sectional view along the line H-H' shown in FIG. 16.

Figure 4A:
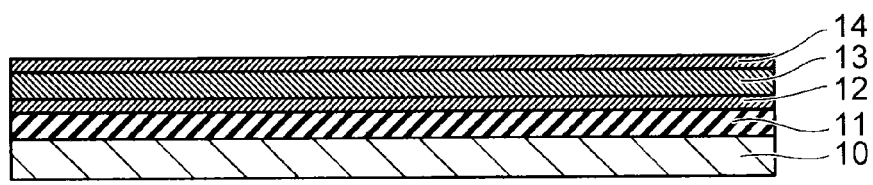
FIGS. 4A, 4B and 4C are cross-sectional views showing an example of the method of manufacturing the semiconductor memory device according to the first embodiment.
Figure 4A:
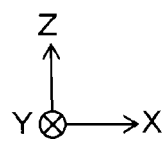

As shown in FIG. 4A, a silicon oxide film, for example, is stacked on the silicon substrate 10 to form the insulating film 11, and then the electrically conductive layer 12, the wiring layer 13, and the electrically conductive layer 14 are stacked thereon in this order.

Figure 4B:
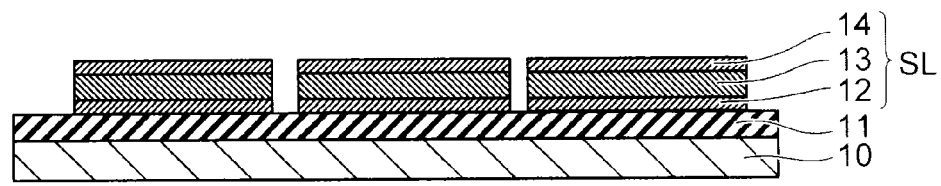
Figure 4B:
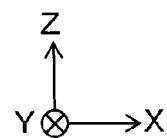

As shown in FIG. 4B, the ranges in which the source lines SL are respectively formed are specified by lithography and then dry etching is performed thereon to thereby selectively remove the electrically conductive layer 12, the wiring layer 13, and the electrically conductive layer 14 to form the source lines SL extending in the Y-direction and separated in the X-direction from each other.

Figure 4C:
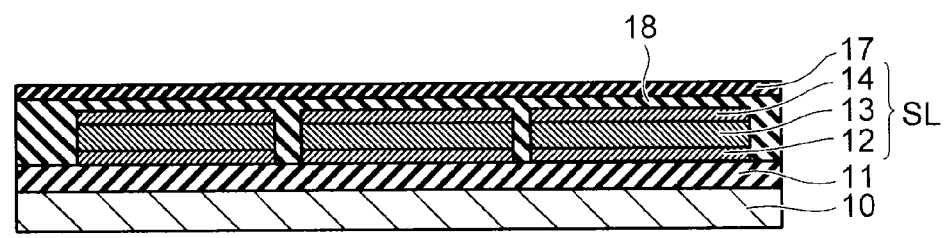
Figure 4C:
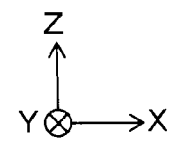

As shown in FIG. 4C, an insulating material is stacked on the upper surface of the insulating film 11 and the surfaces of the source lines SL, and then the upper surface is planarized to form the insulating member 18. The insulating film 17 is formed on the insulating member 18.

Figure 5:
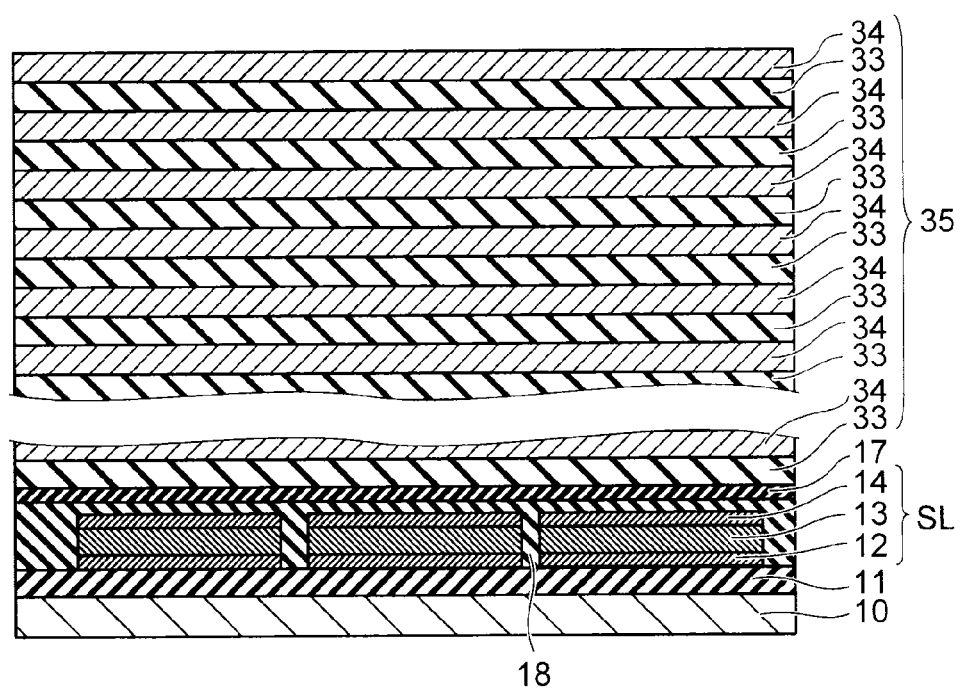
FIGS. 5 to 7 are cross-sectional views showing an example of the method of manufacturing the semiconductor memory device according to the first embodiment.
Figure 5:
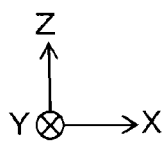

As shown in FIG. 5, the insulating films 33 including silicon oxide and filling films 34 including silicon nitride, for example, are stacked alternately on the insulating film 17 using a chemical vapor deposition (CVD) method to form a stacked body 35.

Figure 6:
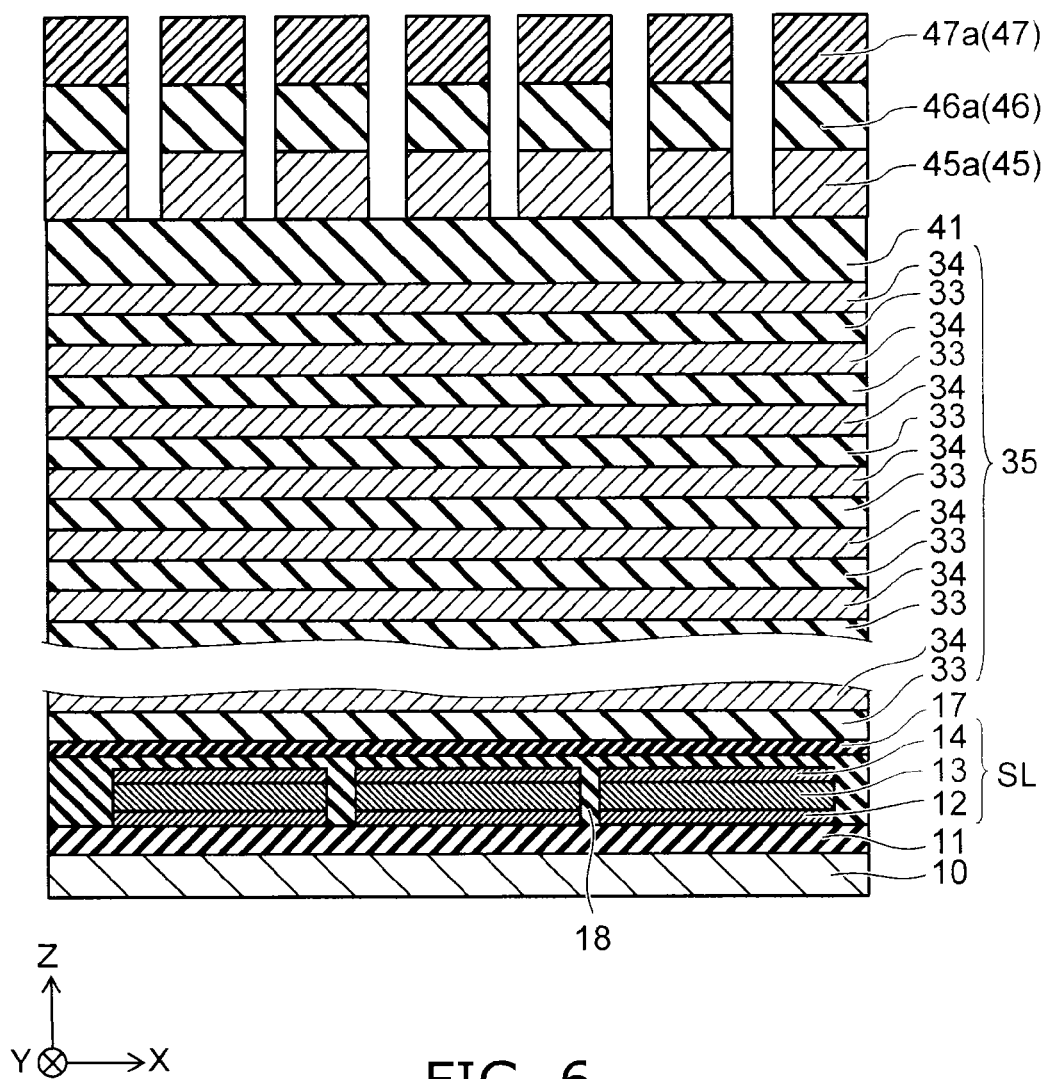

As shown in FIG. 6, silicon oxide ($SiO_2$) is stacked on the stacked body 35 using a CVD method using, for example, TEOS (Tetra Ethyl Ortho Silicate; $Si(OC_2H_5)_4$) as a raw material to form a mask 41. A hard mask 45 is formed on the mask 41, and then an antireflective film 46 functioning as DARC (Dielectric Anti Reflective Coating) is formed on the hard mask 45. A resist film 47 is formed on the antireflective film 46.

Subsequently, by exposing and then developing the resist film 47, resist patterns 47a extending in the Y-direction and separated in the X-direction from each other are formed. Then, by performing etching using the resist patterns 47a as a mask, the antireflective film 46 and the hard mask 45 are also divided into parts separated in the X-direction from each other similarly to the resist patterns 47a, and thus the antireflective films 46a and the hard masks 45a are formed.

As shown in FIG. 7, by performing etching using the resist patterns 47a as a mask, the mask 41 is patterned to form the masks 41a extending in the Y-direction and separated in the X-direction from each other. Etching such as RIE (Reactive Ion Etching) is performed using the masks 41a as a mask to thereby form memory cell trenches MT each shaped like a trench penetrating the stacked body 35 and the insulating film 17 in the Z-direction to reach the source line SL, and spreading along the Y-Z plane.

Figure 8:
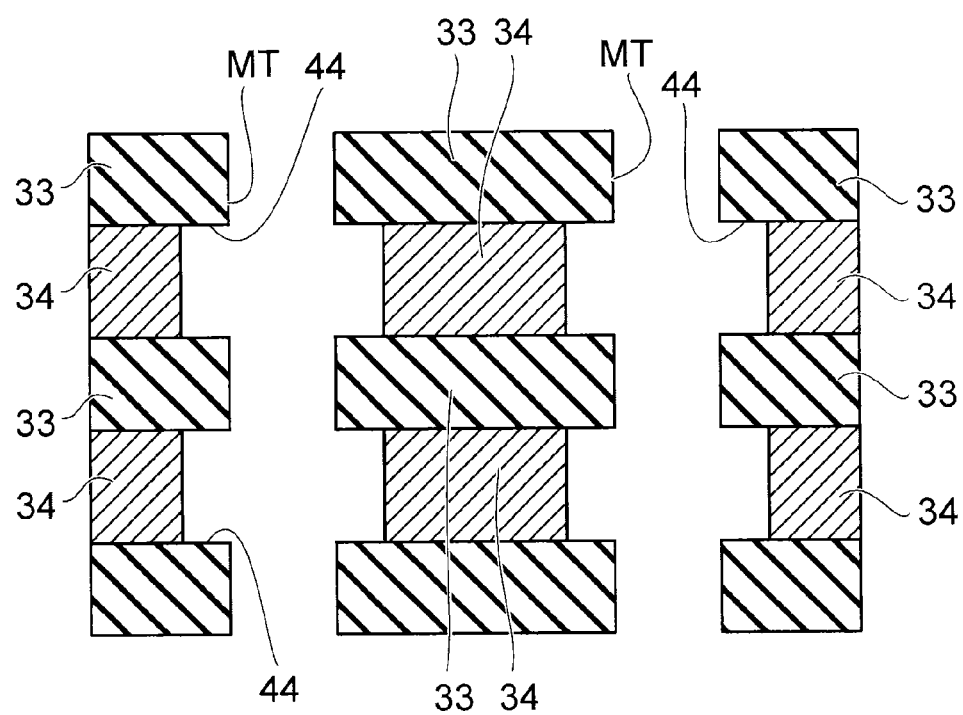
FIGS. 8 and 9 are cross-sectional views showing an example of the method of manufacturing the semiconductor memory device according to the first embodiment.

As shown in FIG. 8, wet etching using, for example, hot phosphoric acid ($H_3PO_4$), the chemical for removing silicon nitride, as an etchant is performed via the memory cell trenches MT. Thus, a part of each of the filling films 34 located on the memory cell trench MT side is removed to form recesses 44 on the side surfaces of each of the memory cell trenches MT.

Figure 9:
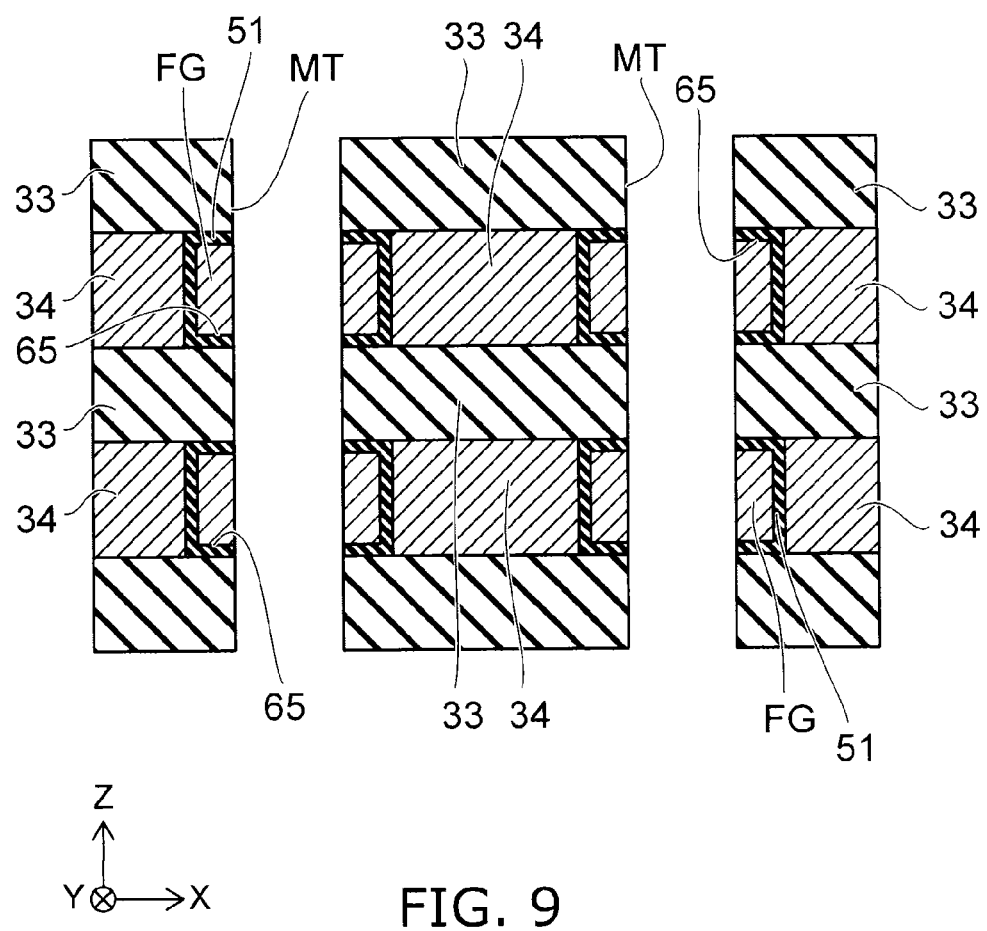

As shown in FIG. 9, silicon nitride (SiN), ruthenium (Ru), and silicon nitride, for example, are deposited on the side surfaces of each of the memory cell trenches MT and the inner surface of each of the recesses 44 in this order using a CVD (Chemical Vapor Deposition) method to form the block insulating films 51. Since the block insulating films 51 are deposited with a roughly even thickness, recesses 65 reflecting the recesses 44 are formed on the surface of each of the block insulating films 51. Polysilicon, for example, is deposited on the surface of each of the block insulating films 51 to form the floating gate electrodes FG. On this occasion, the recesses 65 are filled with polysilicon.

The floating gate electrodes FG disposed on the side surfaces of each of the memory cell trenches MT are removed by performing, for example, CDE (Chemical Dry Etching) using TMY (choline aqueous solution) as an etchant. The block insulating films 51 disposed on the side surfaces of each of the memory cell trenches MT are removed by performing wet etching using hot phosphoric acid as an etchant to expose the insulating films 33. Thus, the block insulating films 51 and the floating gate electrodes FG are divided into parts corresponding to the respective layers in the Z-direction.

Figure 10:
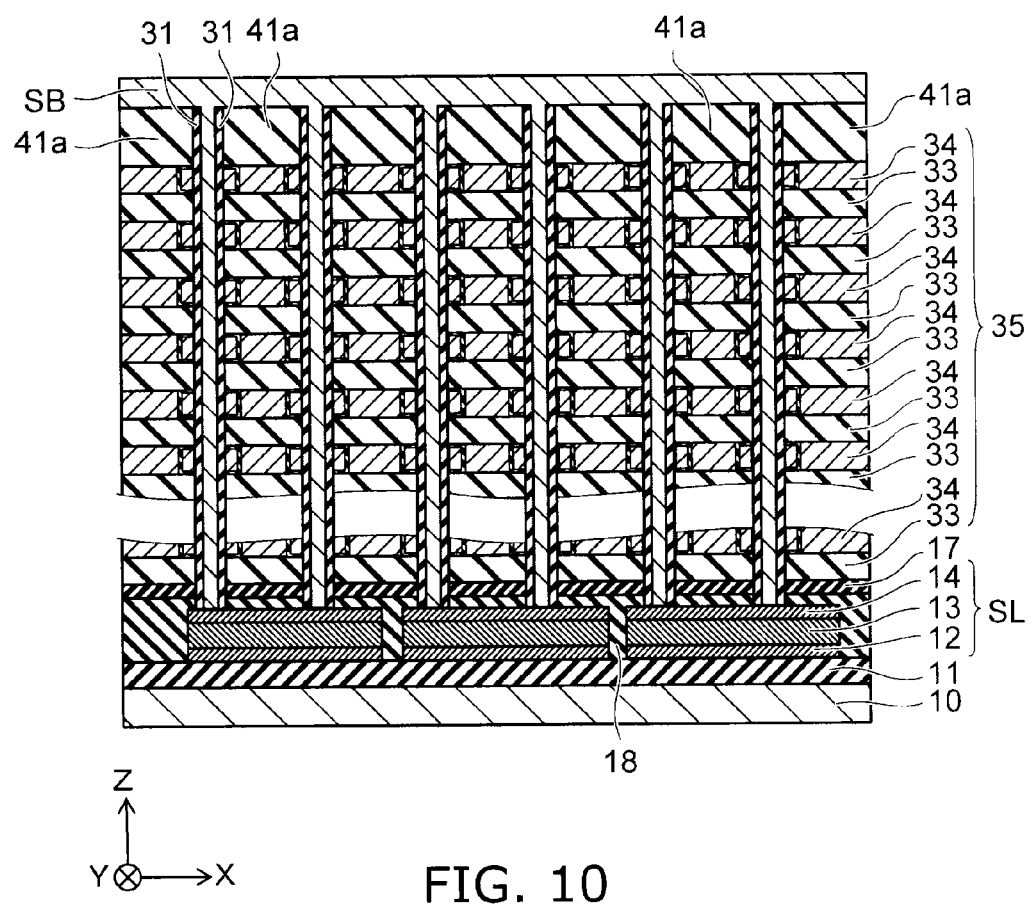
FIG. 10 is a cross-sectional view showing an example of the method of manufacturing the semiconductor memory device according to the first embodiment.
Figure 11:
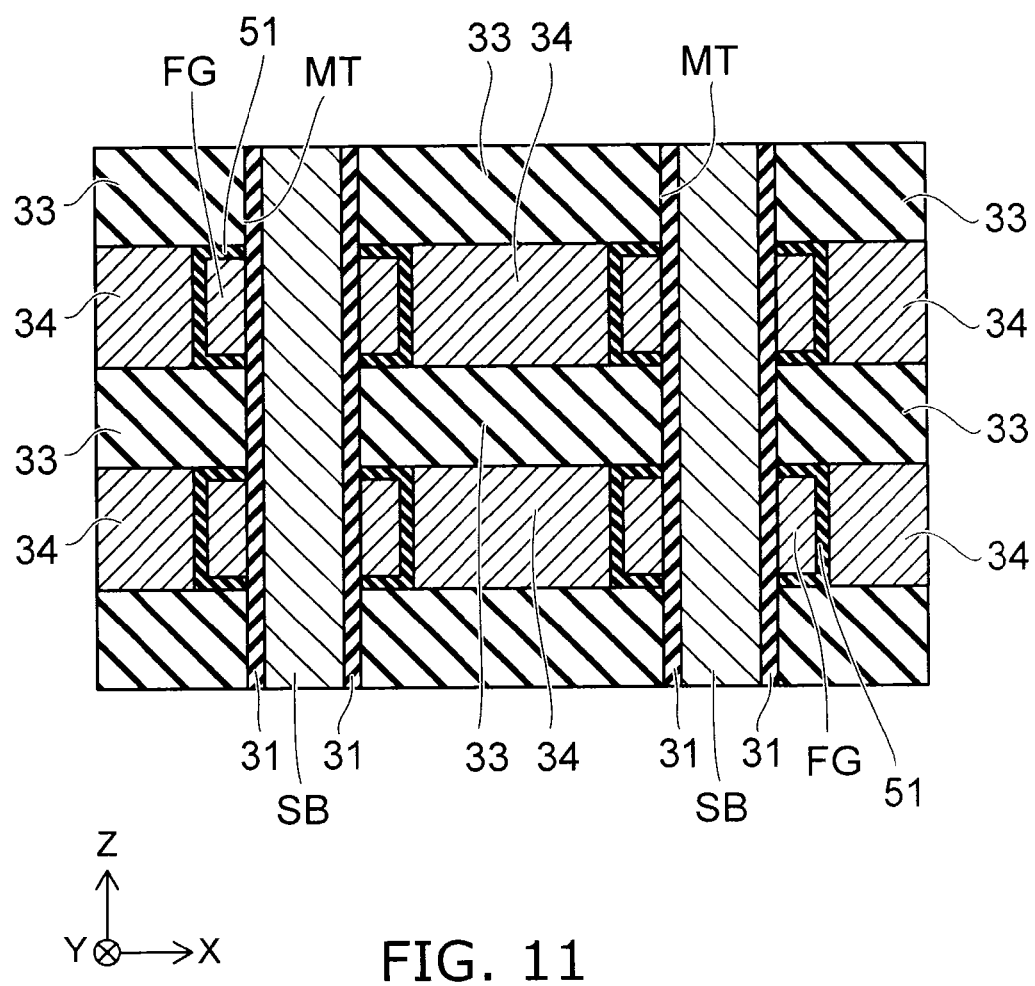
FIG. 11 is a cross-sectional view showing an example of the method of manufacturing the semiconductor memory device according to the first embodiment.

As shown in FIGS. 10 and 11, silicon oxide is deposited on the side surface of each of the insulating films 33, the side surfaces of each of the block insulating films 51, and the side surface of each of the floating gate electrodes FG using, for example, an ALD (Atomic Layer Deposition) method to thereby form the tunnel insulating films 31. For example, amorphous silicon (a-Si) is deposited on the surface of each of the tunnel insulating films 31 to form a cover film. The tunnel insulating film 31 and the cover film are also formed on the bottom portion of each of the memory cell trenches MT.

The tunnel insulating film 31 and the cover film formed in the bottom portion of each of the memory cell trenches MT are partially removed by performing RIE to thereby expose the upper surface of each of the source lines SL. For example, amorphous silicon is deposited inside each of the memory cell trenches MT, on the upper surface of each of the tunnel insulating films 31 and the upper surface of each of the masks 41a to form core sections. Subsequently, an annealing treatment is performed to crystallize amorphous silicon of the cover films and amorphous silicon in the core sections to thereby form a silicon body SB.

As shown in FIG. 12, by etching back the silicon body SB to make the upper surface thereof recede to thereby expose the upper surface of each of the tunnel insulating films 31 and the upper surface of each of the masks 41a. Silicon oxide ($SiO_2$) is deposited on the tunnel insulating films 31, the silicon body SB, and the masks 41a, using, for example, a CVD method using dTEOS as a raw material to form a mask 42. A pattern film 43 is formed on the mask 42, and then an antireflective film 64 is formed on the pattern film 43. A resist film 48 is formed on the antireflective film 64.

Subsequently, by exposing and then developing the resist film 48, resist patterns 48a extending in the X-direction and separated in the Y-direction from each other are formed. By performing etching using the resist patterns 48a as a mask, the antireflective film 64 and the pattern film 43 are also divided into parts separated in the Y-direction from each other similarly to the resist patterns 48a, and thus the antireflective films 64a and the pattern films 43a are formed.

FIG. 13 is a cross-sectional view along the line H-H' shown in FIG. 12.

As shown in FIG. 13, the mask 42 is patterned to form the masks 42a. The masks 42a extend in the X-direction, and are separated in the Y-direction from each other. The masks 41a extend in the Y-direction, and are separated in the X-direction from each other. The masks 41a are arranged so as to be distant in the X-direction from each other as much as a length D10, and the masks 42a are arranged so as to be distant in the Y-direction from each other as much as a distance D11 or as much as a distance D12 longer than the distance D11.

The masks 41a and the masks 42a form opening sections 49a each having a length in the X-direction of D10 and a length in the Y-direction of D11, and opening sections 49b having a length in the X-direction of D10 and a length in the Y-direction of D12. The opening area of each of the opening sections 49b is larger than the opening area of each of the opening sections 49a, and the opening sections 49b and the opening sections 49a each have a rectangular shape. The opening sections 49a and the opening sections 49b are intermittently arranged along the Y-direction in the area immediately above the memory cell trenches MT, but is not disposed in the area immediately above the filling films 34.

Figure 14:
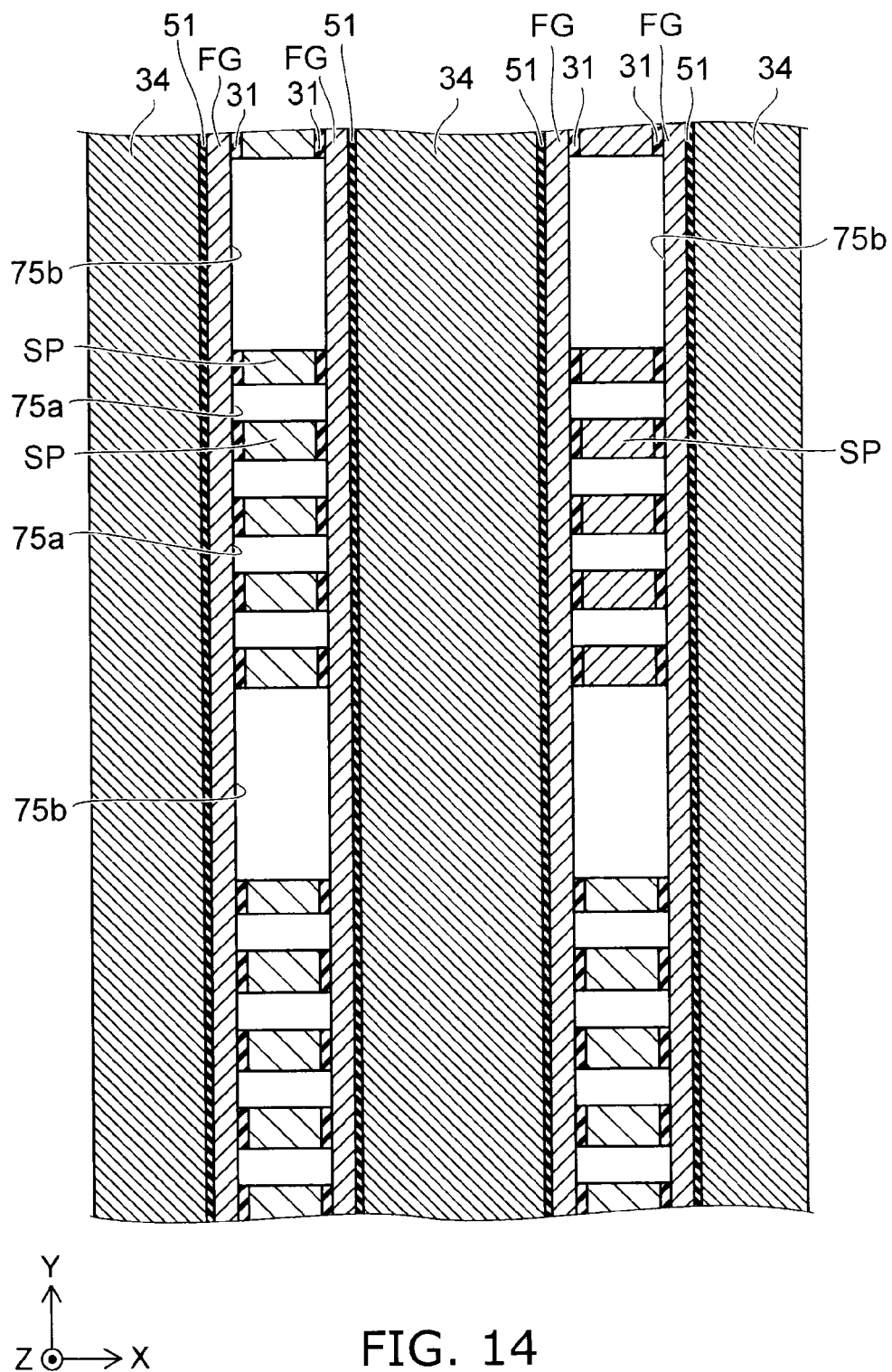
FIGS. 14 and 15 are cross-sectional views showing an example of the method of manufacturing the semiconductor memory device according to the first embodiment.

As shown in FIG. 14, by performing, for example, wet etching using the masks 41a and the masks 42a (see FIG. 13) as a mask, silicon body SB and the tunnel insulating films 31 are divided along the Y-direction.

Thus, in the silicon body SB and the tunnel insulating films 31, a through hole 75a is formed in an area immediately below each of the opening sections 49a, and a through hole 75b is formed immediately below each of the opening sections 49b. The through holes 75a and the through holes 75b penetrate the stacked body 35 and the insulating film 17 in the Z-direction. The silicon body SB and the tunnel insulating films 31 are divided by the through holes 75a and the through holes 75b along the Y-direction. The silicon body SB is thus divided into parts, and the parts of the silicon body SB are each referred to as the silicon pillar SP.

Figure 15:
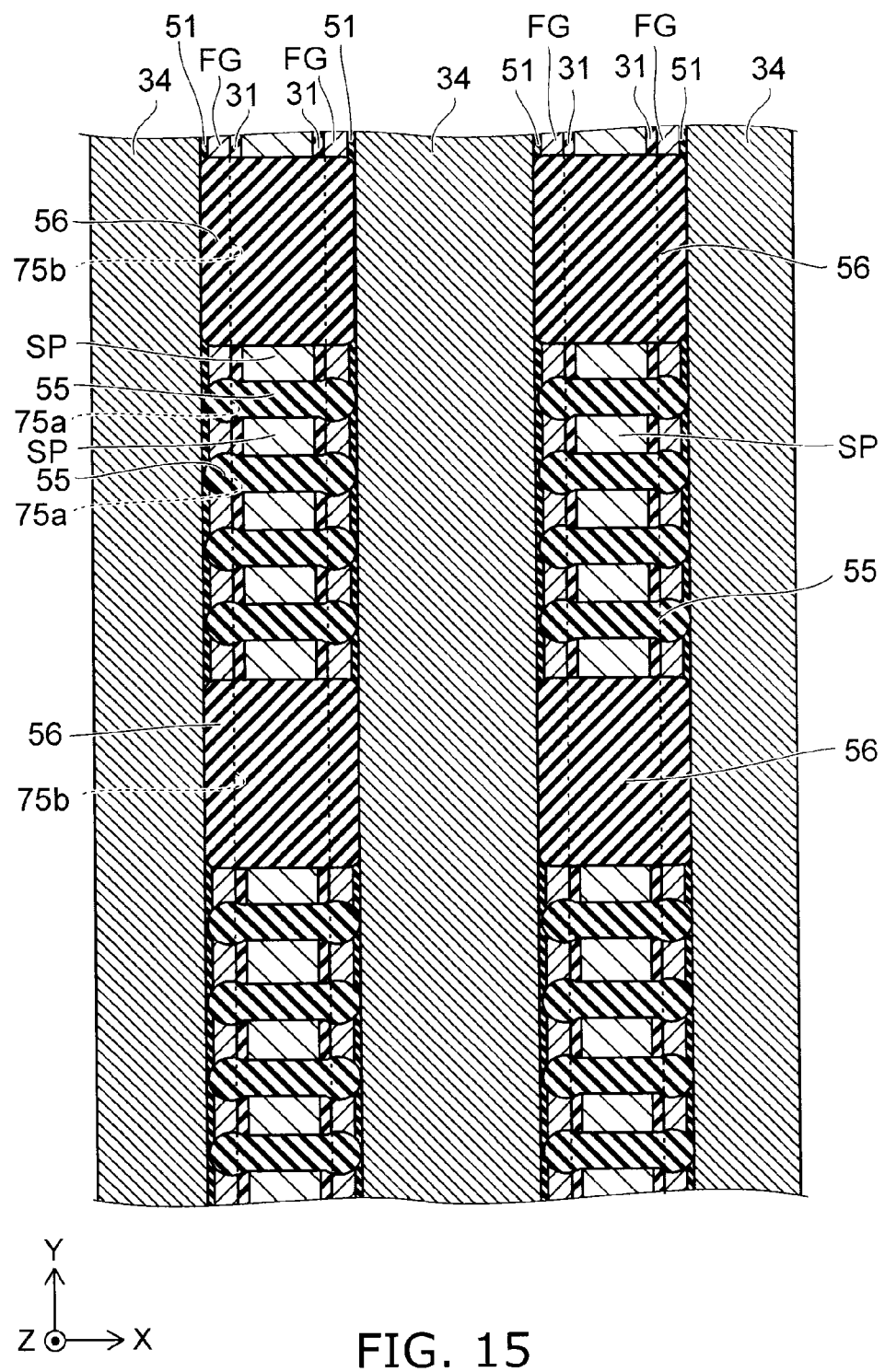

As shown in FIG. 15, by performing isotropic etching such as CDE or wet etching, the floating gate electrodes FG and the block insulating films 51 are selectively removed via the through holes 75a, 75b. Thus, the floating gate electrodes FG and the block insulating films 51 are divided along the Y-direction. On this occasion, the filling films 34 made of silicon nitride remain unremoved. The through holes 75a, 75b are filled with, for example, silicon oxide to form the insulating members 55 and the insulating members 56. The masks 42a, the pattern film 43, the antireflective films 64a, and the resist film 48 are removed to planarize the upper surfaces of the masks 41a.

As shown in FIGS. 16 and 17, a hard mask 72 having opening sections 72a arranged along the X-direction and the Y-direction in a zigzag manner is formed on the masks 41a. The opening sections 72a each have a rectangular shape having a longitudinal direction parallel to the X-direction, and are disposed in the areas immediately above the insulating members 56 in order to divide the insulating members 56. The opening sections 72a are not disposed in the areas immediately above the insulating members 55 and the areas immediately above the silicon pillars SP. Further, in the case in which the opening section 72a is disposed in the area immediately above the insulating member 56 of the array 54a, the opening section 72a is not disposed in the area immediately above the insulating member 56 of the array 54b located across the filling film 34 from the insulating member 56 of the array 54a.

In the X-direction, the length D3 of the insulating member 56 is shorter than the length D5 of the opening section 72a. In the Y-direction, the length D6 of the insulating member 56 is longer than the length D7 of the opening section 72a. Therefore, in the X-direction, the both end portions of the opening section 72a protrude from the memory cell trench MT.

Figure 18:
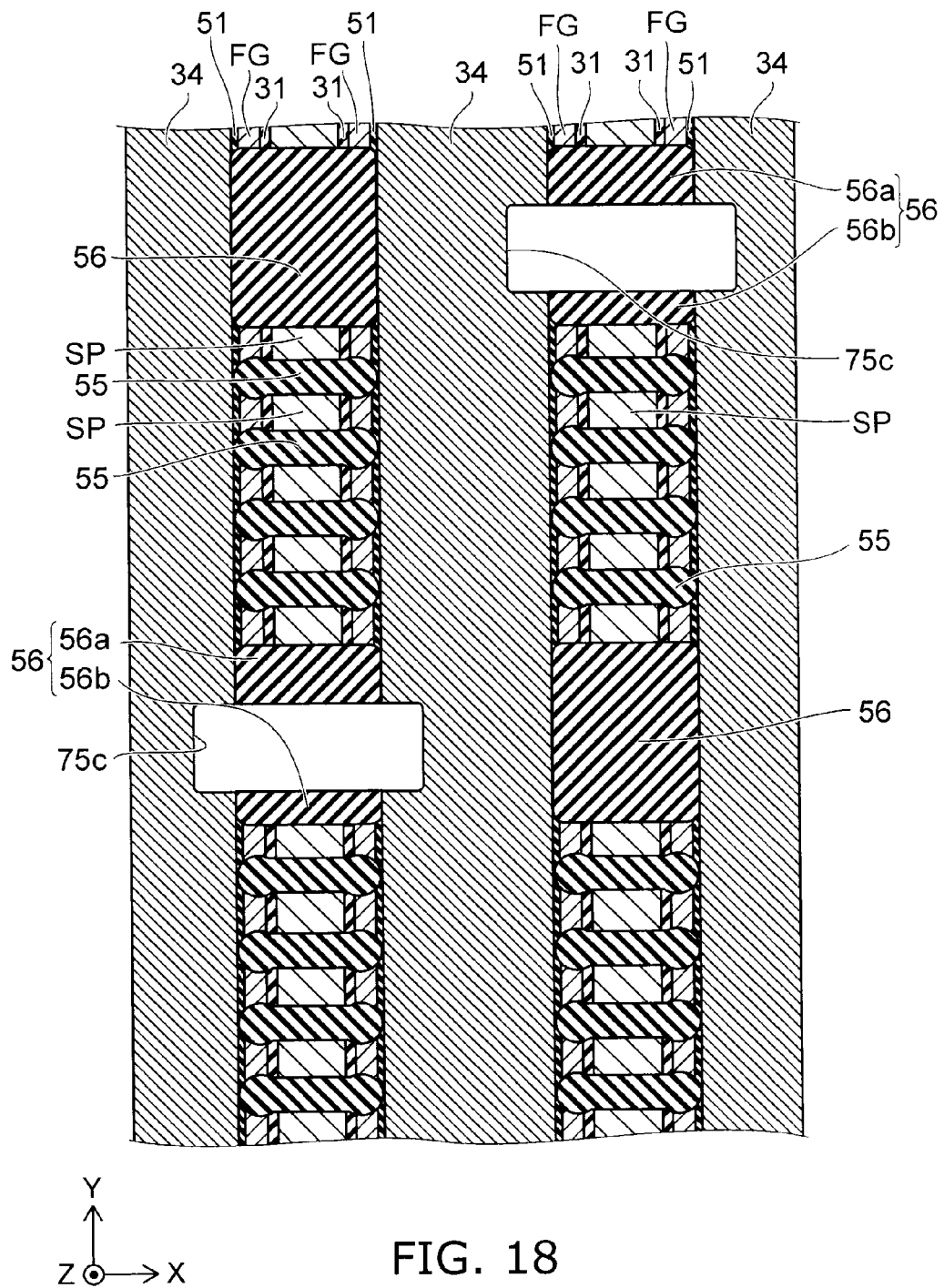
FIG. 18 is a cross-sectional view showing an example of the method of manufacturing the semiconductor memory device according to the first embodiment.

FIG. 18 is a cross-sectional view along the line I-I' shown in FIG. 12.

Figure 19:
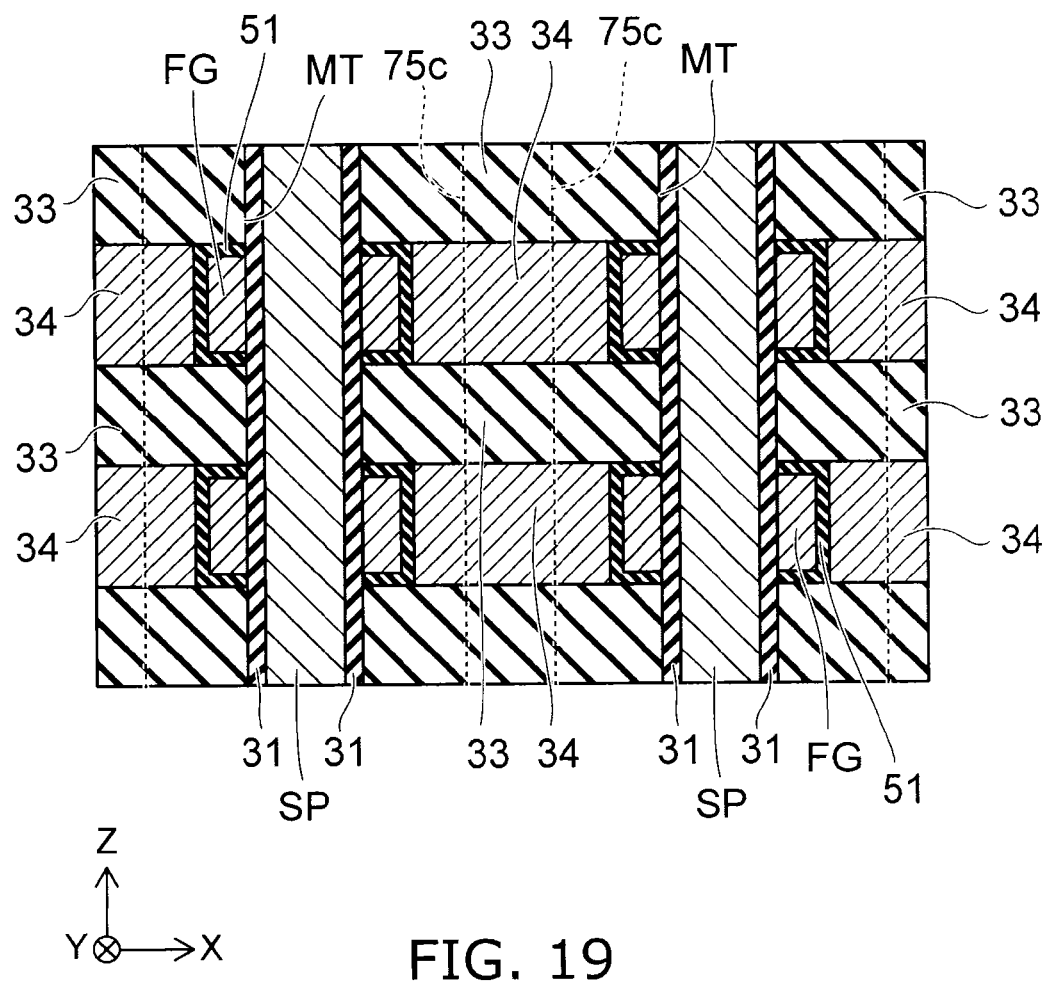
FIGS. 19 to 21 are cross-sectional views showing an example of the method of manufacturing the semiconductor memory device according to the first embodiment.

FIG. 19 is a cross-sectional view showing the area F shown in FIG. 7.

As shown in FIGS. 18 and 19, for example, wet etching is performed using the hard mask 72 as a mask to remove a part of each of the insulating films 33, a part of each of the filling films 34, and a part of each of the insulating members 56. Thus, a through hole 75c is formed in an area immediately below each of the opening sections 72a. Some of the insulating members 56 are divided by the through holes 75c along the Y-direction to form the insulating members 56a and the insulating members 56b. On the side surfaces of the through hole 75c, there are exposed the insulating films 33, the filling films 34, the insulating member 56a, and the insulating member 56b.

Figure 20:
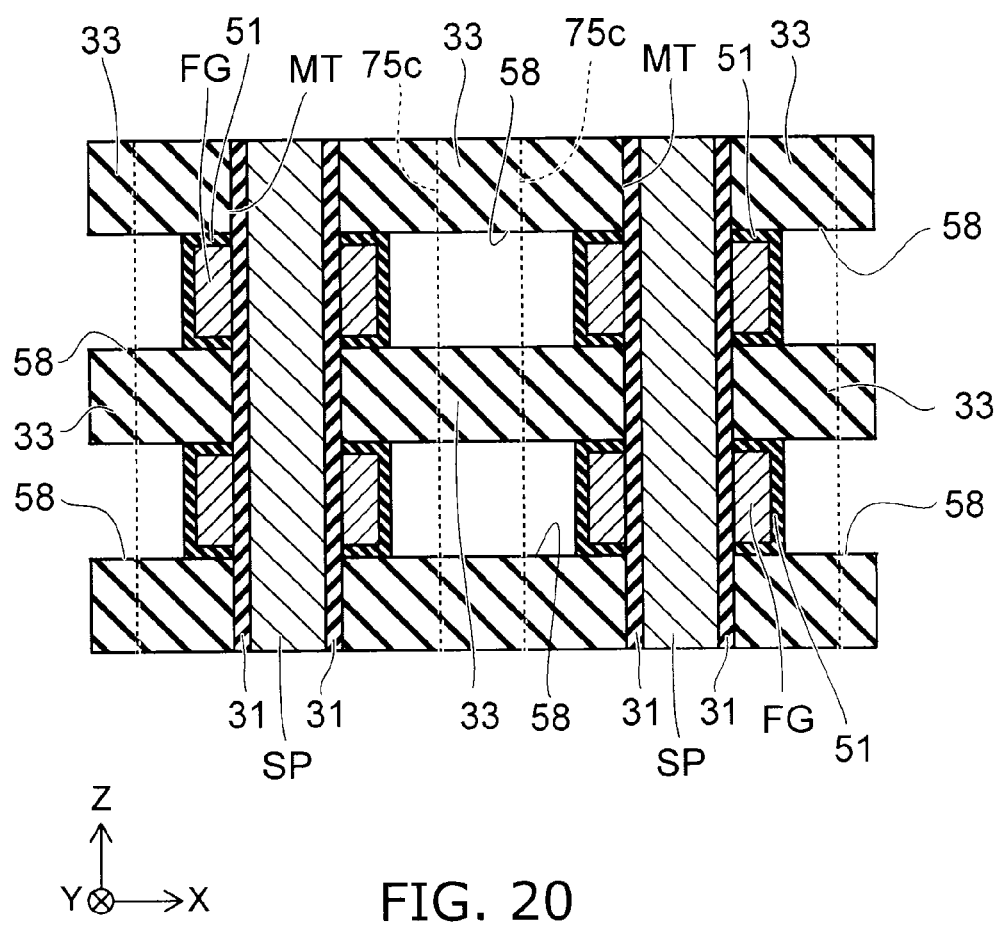

As shown in FIG. 20, wet etching using, for example, hot phosphoric acid, the chemical for removing silicon nitride, as an etchant is performed via the through holes 75c. Thus, the filling films 34 communicating with the through holes 75c are removed, a hollow section 58 is formed in the area where the filling films 34 are removed, and the insulating films 33, the block insulating films 51, the insulating members 55, and the insulating members 56 are exposed inside the hollow section 58. The hollow section 58 is surrounded by the insulating films 33, the block insulating films 51, the insulating members 55, and the insulating members 56, and is formed of a hollow section 58a (not shown) extending in the Y-direction and a hollow section 58b (not shown) shaped like a belt extending in the X-direction in the destination of the extension in the Y-direction.

Figure 21:
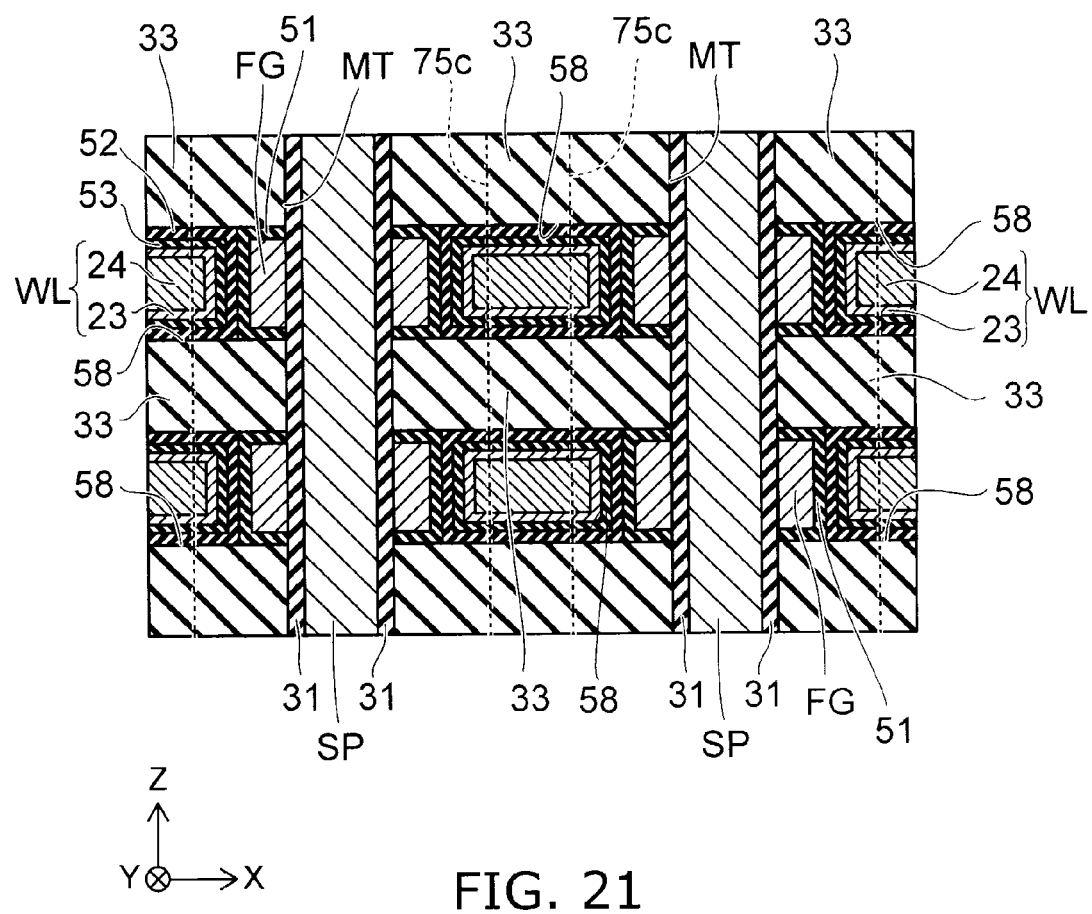
Figure 22:
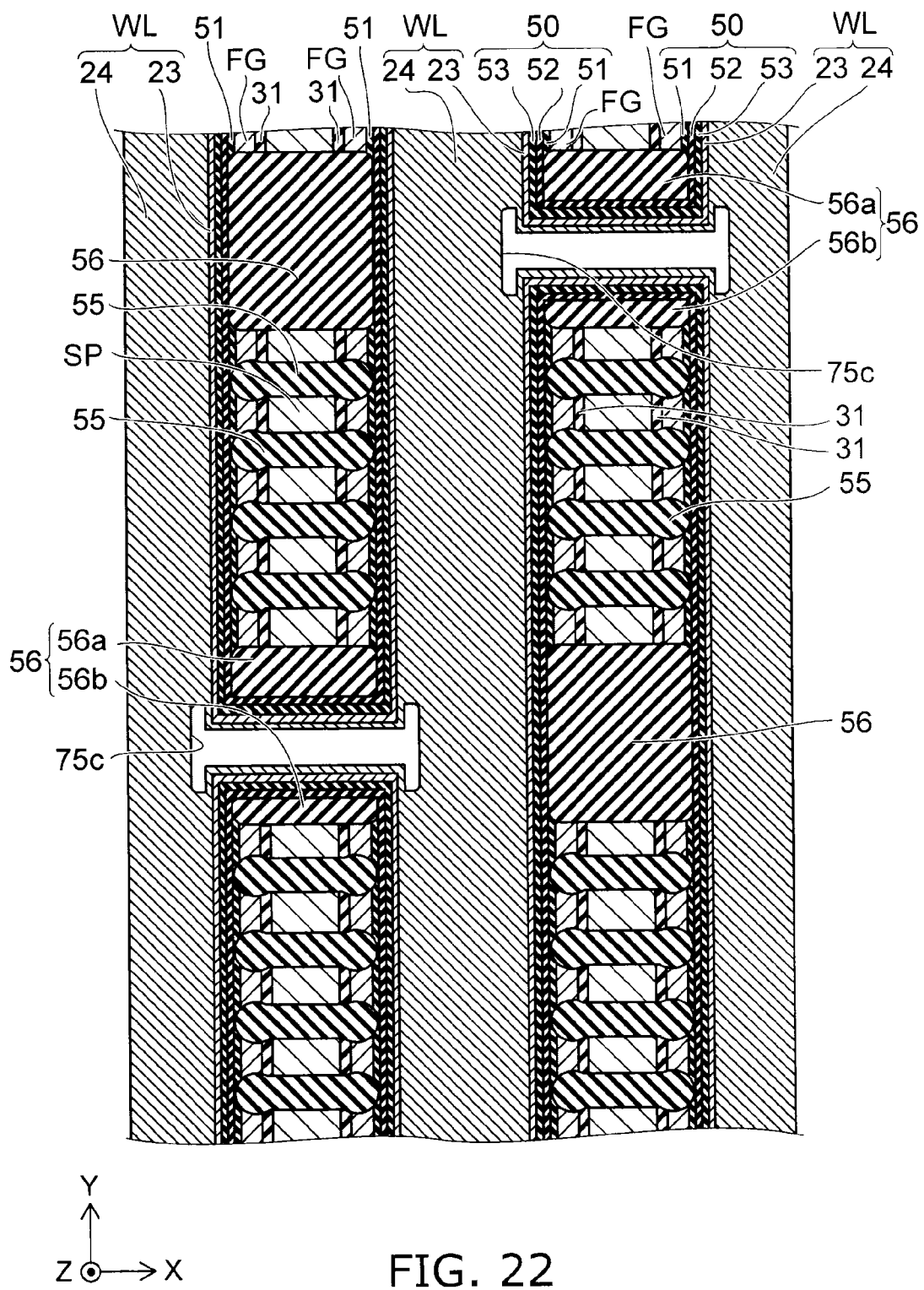
FIGS. 22 and 23 are cross-sectional views showing an example of the method of manufacturing the semiconductor memory device according to the first embodiment.

As shown in FIGS. 21 and 22, on the inner surfaces of the hollow section 58, namely on the surfaces of the insulating films 33, the block insulating films 51, and the insulating members 55, 56 exposed inside the hollow section 58, silicon oxide, for example, is deposited to form the block insulating films 52. Hafnium silicon oxide, for example, is deposited on the surface of each of the block insulating films 52 to form the block insulating films 53.

Titanium nitride, for example, is deposited on the surface of each of the block insulating films 53 to form the barrier metal films 23. In forming the block insulating films 52, the block insulating films 53, and the barrier metal films 23, deposition is performed so as not to completely fill in the hollow section 58, but to roughly homogenize the film thickness. Tungsten, for example, is deposited on the surface of each of the barrier metal films 23 so as to fill in the hollow section 58, but not to completely fill in the through holes 75c, to thereby form the electrically conductive members 24.

Figure 23:
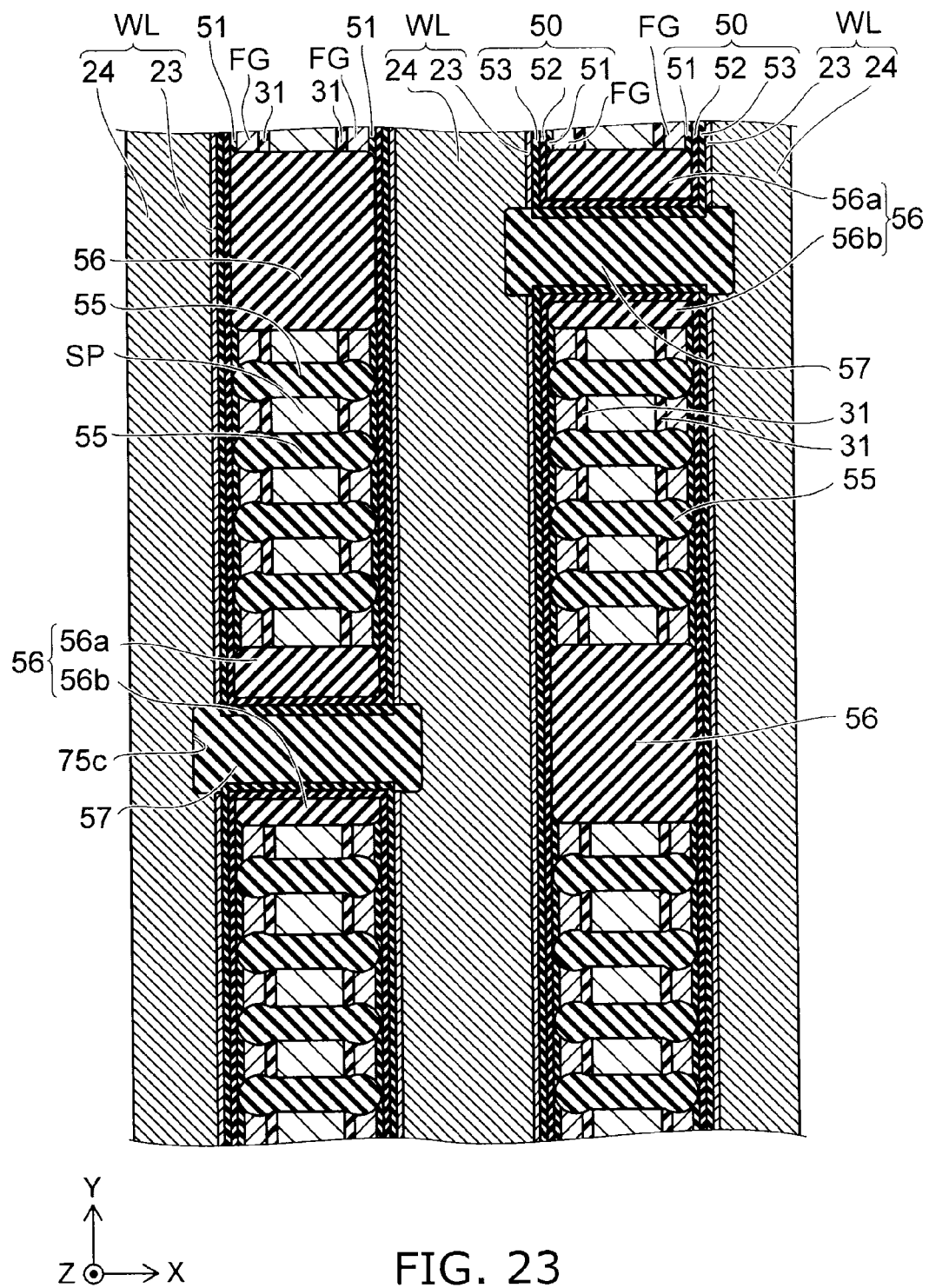

As shown in FIG. 23, the electrically conductive members 24 and the barrier metal films 23 formed on the side surfaces of the through holes 75c are removed. Thus, the electrically conductive members 24 and the barrier metal films 23 are each divided in the X-direction. The through holes 75c are filled with, for example, silicon oxide to form insulating members 57.

Figure 24:
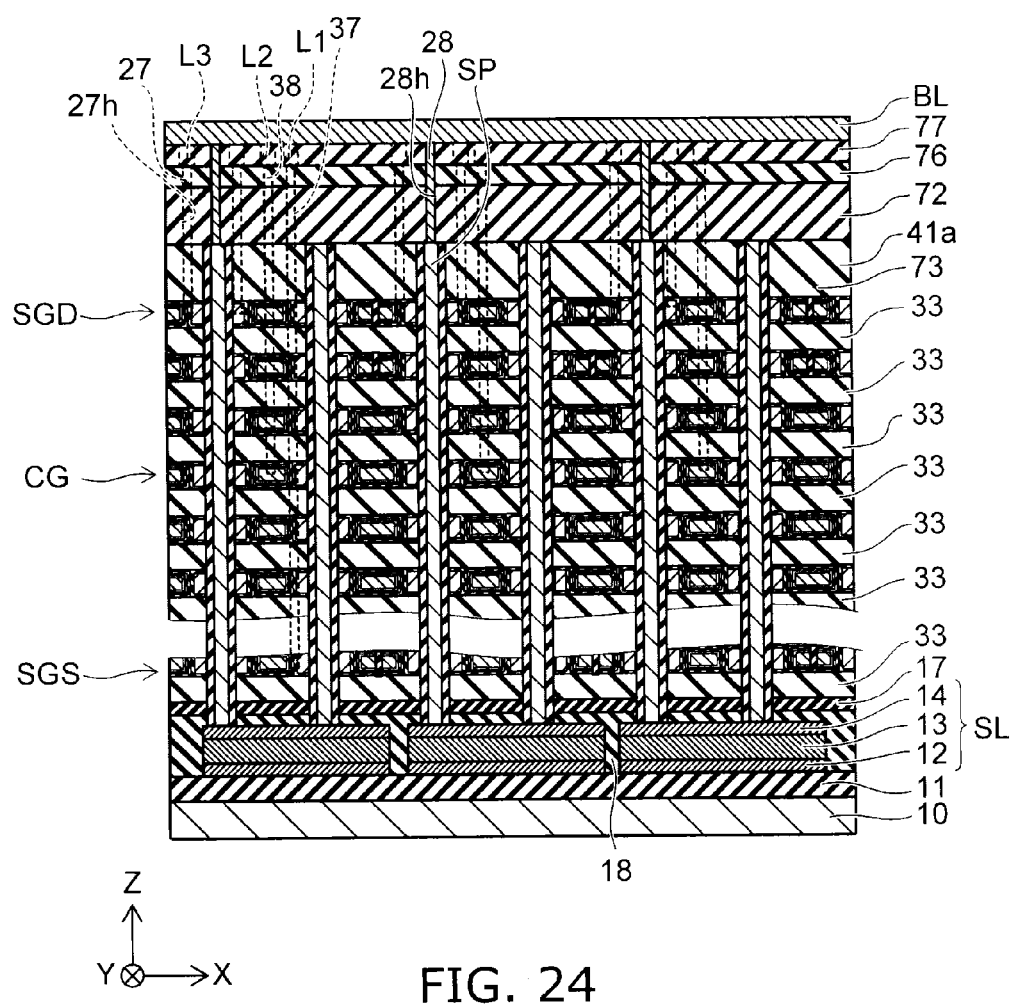
FIG. 24 is a cross-sectional view showing an example of the method of manufacturing the semiconductor memory device according to the first embodiment.

As shown in FIG. 24, an insulating member 76 is formed on the hard mask 72. In the area immediately above the Y-direction end portion of the drain-side selecting gate electrode SGD, there is formed a contact hole 27h penetrating the insulating member 76, the hard mask 72, and the mask 41a in the Z-direction to reach the drain-side selecting gate electrode SGD. The contact holes 27h are filled with, for example, tungsten to form the contacts 27. On the contacts 27, there are formed the wiring lines L3 separated in the X-direction, and extending in the Y-direction.

In the area immediately above the Y-direction end portion of the control gate electrode CG, the contact 38 is formed in a similar manner to the formation of the contact 27. On the contacts 38, there are formed the wiring lines L2 separated in the X-direction, and extending in the Y-direction.

In the area immediately above the Y-direction end portion of the source-side selecting gate electrode SGS, the contact 37 is formed in a similar manner to the formation of the contact 27. On the contacts 37, there are formed the wiring lines L1 separated in the X-direction, and extending in the Y-direction. The space between the wiring lines L1, the wiring lines L2, and the wiring lines L3 is filled with the insulating member 77 to planarize the space.

In the area immediately above the silicon pillar SP, there is formed a contact hole 28h penetrating the insulating member 77, the insulating member 76, and the hard mask 72 in the Z-direction to reach the silicon pillar SP. The contact holes 28h are filled with, for example, tungsten to form the contacts 28. On the contacts 28, there are formed the bit lines BL separated in the Y-direction, and extending in the X-direction. In such a manner as described above, the semiconductor memory device 1 according to the embodiment is manufactured.

Advantages of the embodiment will be explained.

In the semiconductor memory device 1 according to the embodiment, between the block insulating film 50 of the array 54a and the block insulating film 50 of the array 54b, there is disposed the word line WL, but is not disposed the insulating member. Therefore, the distance between the silicon pillar SPa and the silicon pillar SPb is smaller compared to the case in which the insulating member is disposed between these silicon pillars SPa, SPb.

This is because in the manufacturing method according to the embodiment, as shown in FIG. 18, since the through holes 75c are formed so as to overlap the memory cell trenches MT, the block insulating films 52, the block insulating films 53, and the word lines WL are formed via the through holes 75c, it is not necessary to form a slit substituting for the through hole 75c between the array 54a and the array 54b.

Thus, it is possible to decrease the distance between the silicon pillar SPa and the silicon pillar SPb due to the elimination of the slit, to thereby dispose a larger number of silicon pillars SP. As a result, it is possible to provide a semiconductor memory device incorporating a larger number of memory cells to thereby achieve high integration, and a method of manufacturing the semiconductor memory device.

Further, it is possible to increase the cross-sectional area parallel to the X-Z plane of the word line WL compared to the case in which the insulating member is disposed between the block insulating film 50 of the array 54a and the block insulating film 50 of the array 54b, to thereby decrease the resistance of the word line WL. Thus, it is possible to decrease the amount of delay due to the resistance of the word line WL to make the semiconductor memory device operate at high speed.

Comparative Example of First Embodiment

Figure 25:
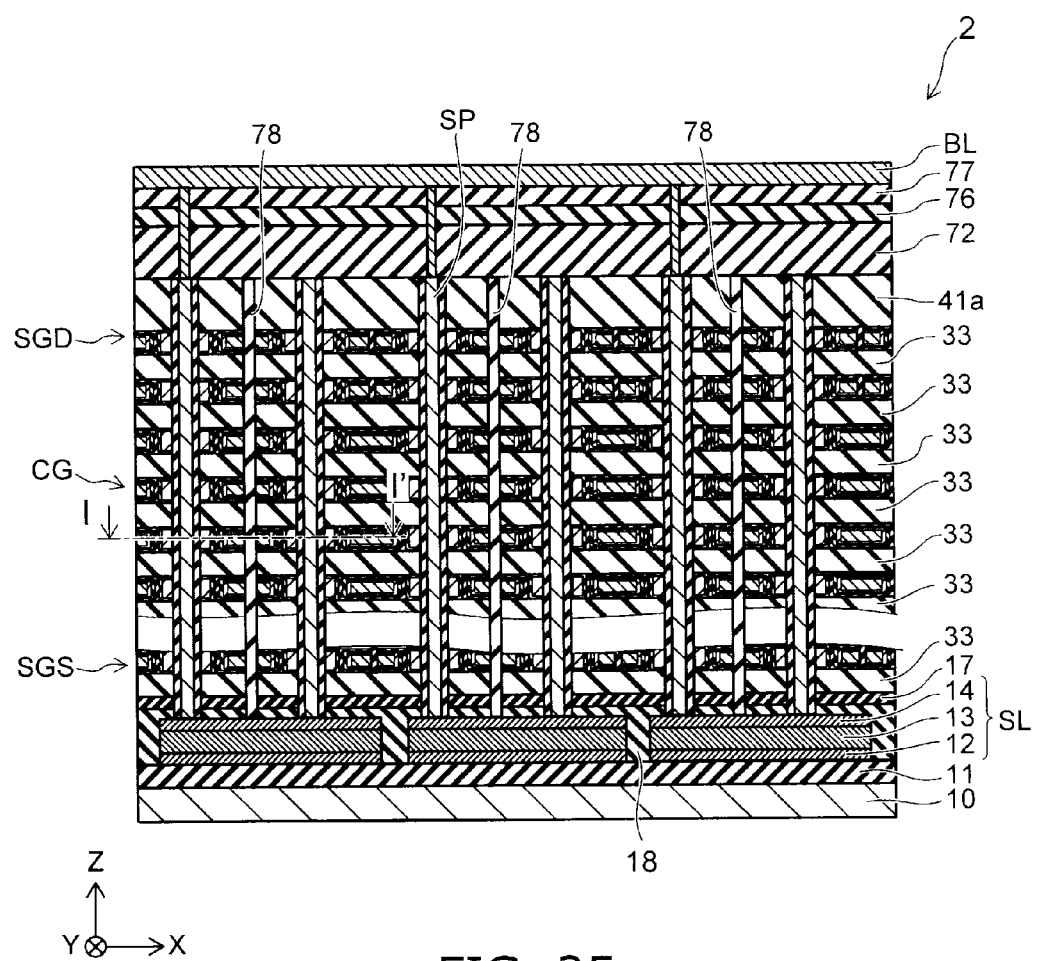
FIG. 25 is a cross-sectional view showing an example of a semiconductor memory device according to a comparative example of the first embodiment.
Figure 26:
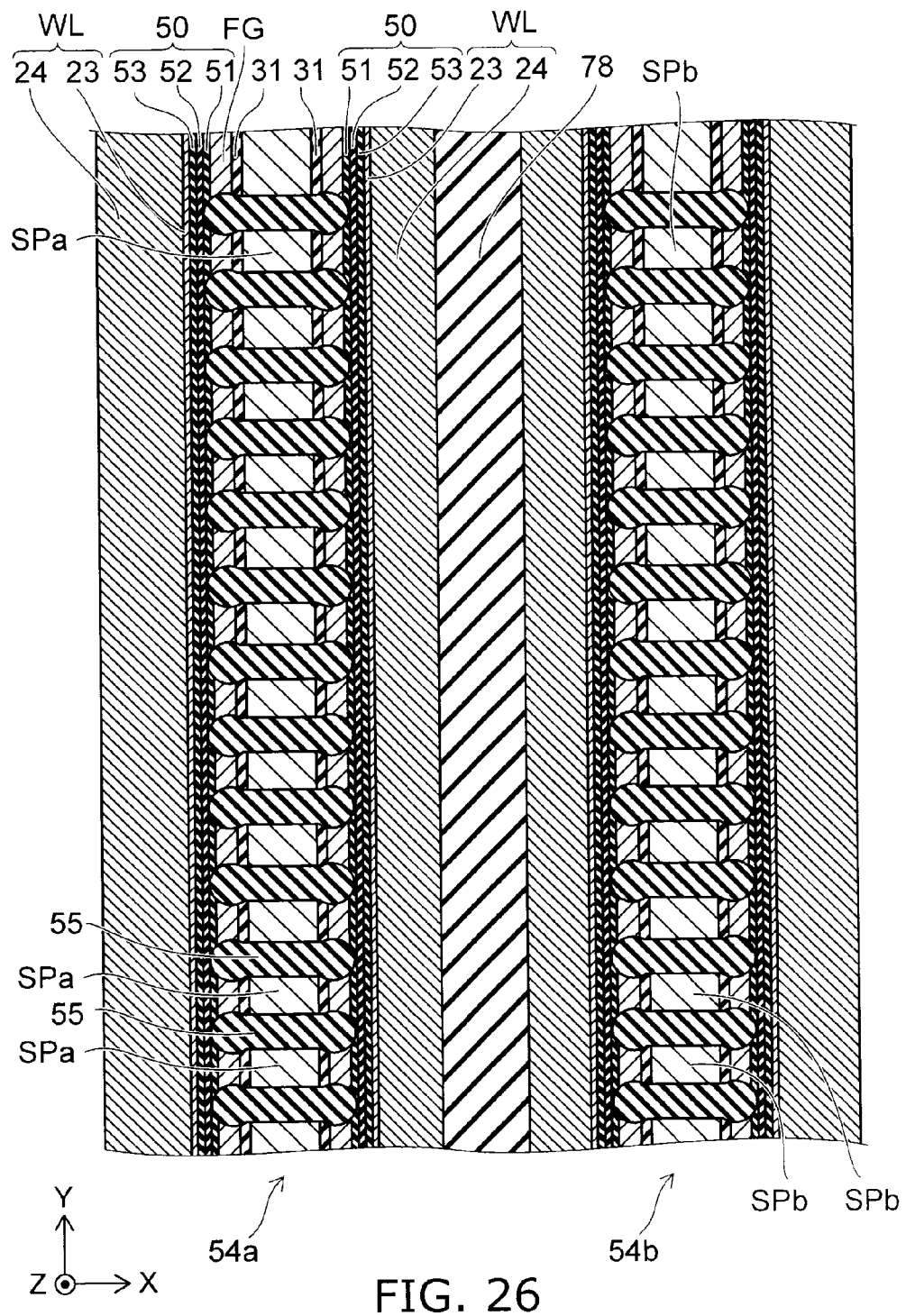
FIG. 26 is a cross-sectional view showing an example of a semiconductor memory device according to a comparative example of the first embodiment.

FIGS. 25 and 26 are cross-sectional views showing an example of a semiconductor memory device according to a comparative example.

FIG. 26 is a cross-sectional view along the line I-I' shown in FIG. 25.

As shown in FIGS. 25 and 26, the semiconductor memory device 2 according to the comparative example is different in the points (a1) and (a2) below compared to the semiconductor memory device 1 (see FIGS. 1 through 3) according to the first embodiment.

(a1) An insulating member 78 shaped like a plate spreading along the Y-Z plane is disposed between the silicon pillar SPa and the silicon pillar SPb.

(a2) The insulating member 56 and the insulating member 57, which extend in the Z-direction, and are larger in the length in the X-direction than the insulating members 55, are not disposed between the silicon pillars SP arranged in the Y-direction.

According to the point (a1) described above, the number of the silicon pillars SP decreases as much as the number of the silicon pillars SP corresponding to one line arranged along the Y-direction. According to the point (a2) described above, although the number of the silicon pillars SP which is arranged along the Y-direction increases, the increment is smaller than the number of the silicon pillars SP corresponding to one line.

Therefore, the decrement in the number of the silicon pillars SP due to the point (a1) described above is larger than the increment in the number of the silicon pillars SP due to the point (a2) described above. Thus, the number of the silicon pillars SP of the comparative example is smaller than the number of the silicon pillars SP of the first embodiment described above.

Further, since the insulating member 78 is disposed, the resistance of the word line WL is higher compared to the first embodiment described above, and the amount of delay due to the increase in the resistance increases.

Second Embodiment

Figure 27:
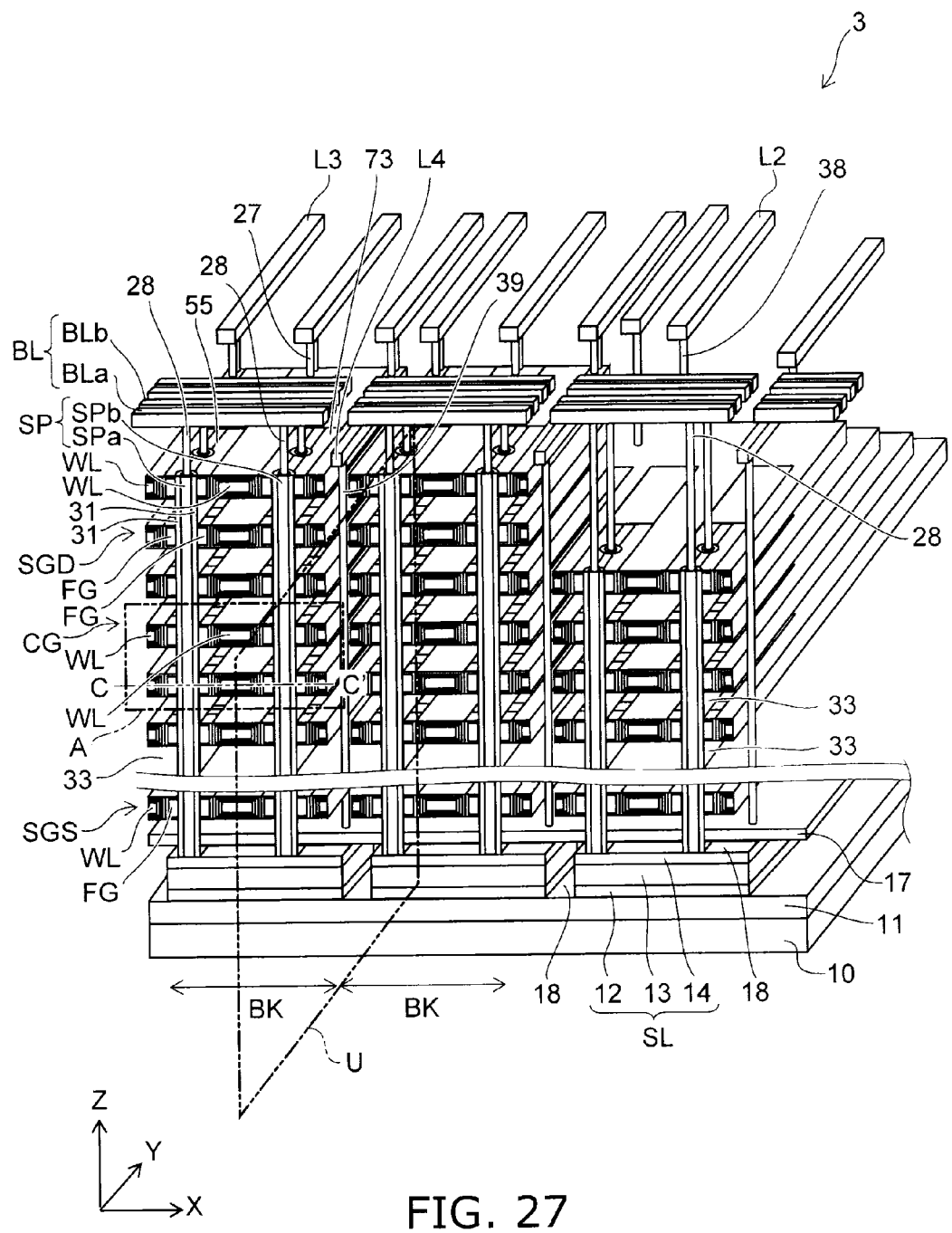
FIG. 27 is a perspective view showing an example of a semiconductor memory device according to a second embodiment.

FIG. 27 is a perspective view showing an example of a semiconductor memory device according to a second embodiment.

Figure 28:
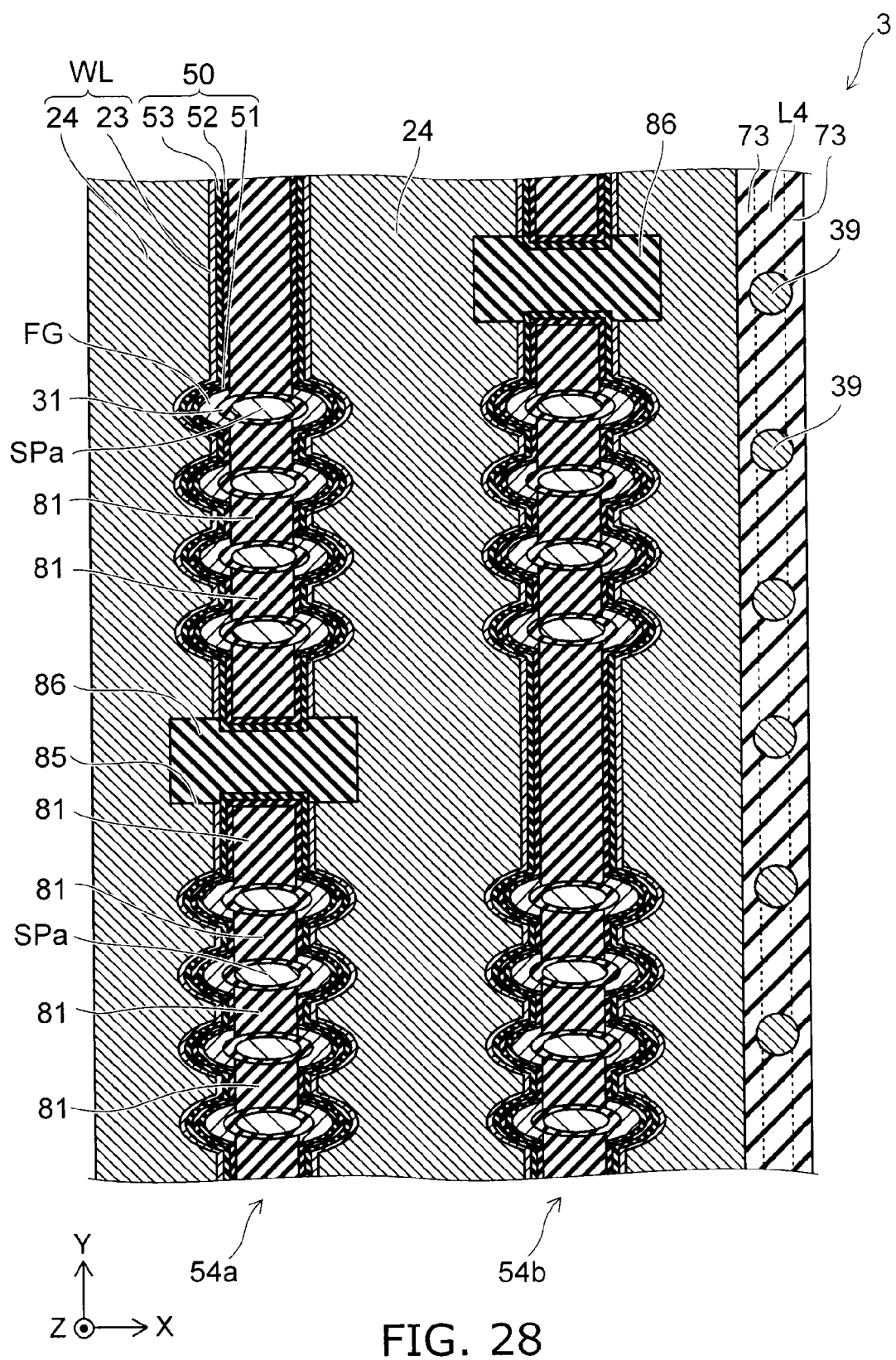
FIG. 28 is a cross-sectional view showing an example of the semiconductor memory device according to the second embodiment.

FIG. 28 is a cross-sectional view showing an example of the semiconductor memory device according to the second embodiment.

FIG. 28 is a cross-sectional view along the line C-C' shown in FIG. 27.

As shown in FIGS. 27 and 28, the semiconductor memory device 3 according to the embodiment is different in the points (b1) through (b6) below compared to the semiconductor memory device 1 (see FIGS. 1 and 3) according to the first embodiment described above.

(b1) The cross-sectional shape of the silicon pillar SPa in the X-Y plane is an ellipse. The silicon pillar SPa, the tunnel insulating film 31, the floating gate electrode FG, the block insulating film 51, the block insulating film 52, the block insulating film 53, the barrier metal film 23, and the electrically conductive member 24 are disposed in this order from the center axis of the ellipse toward the major axis direction of the ellipse.

(b2) The tunnel insulating film 31 is disposed in the entire circumference of the silicon pillar SPa viewed from the Z-direction.

(b3) The floating gate electrode FG has a roughly arched shape formed of a semicircle lacking a central part viewed from the Z-direction.

(b4) A contact 39 extending in the Y-direction is disposed in a part located between the word lines WL adjacent in the Z-direction to each other, and included in a part where the silicon pillar SP is not disposed. The contact 39 is connected to the source line SL.

(b5) On the contact 39, there is disposed a wiring line L4 extending in the Y-direction. The wiring line L4 is connected to the contact 39.

(b6) The silicon pillar SPa, the silicon pillar SPb, the source line SL, and the contact 39 constitute a single block BK. The bit line BL is connected to the silicon pillar in the block BK via the contact 28.

A method of manufacturing the semiconductor memory device according to the embodiment will be explained.

The formation of the stacked body 35 (see FIG. 5) and the preceding processes are substantially the same as those of the first embodiment described above.

FIGS. 29 through 39 are cross-sectional views showing an example of the method of manufacturing the semiconductor memory device according to the embodiment.

Figure 31:
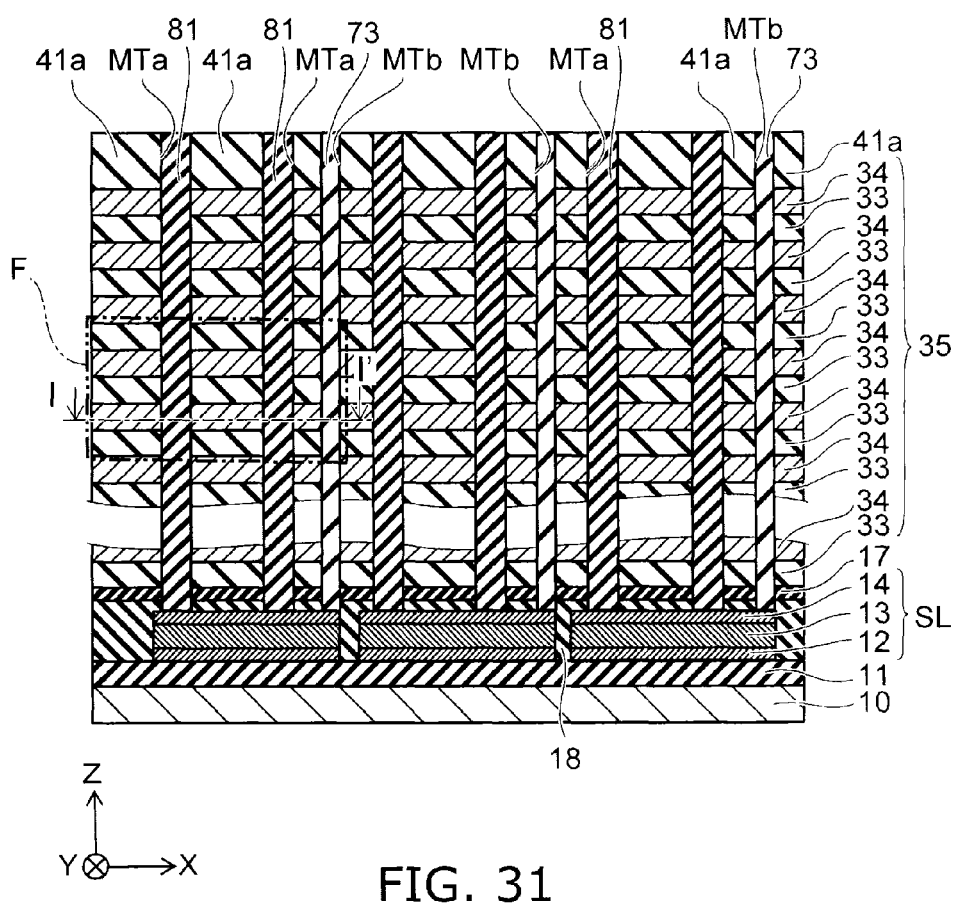
FIG. 31 is a cross-sectional view showing an example of the method of manufacturing the semiconductor memory device according to the second embodiment.
Figure 33:
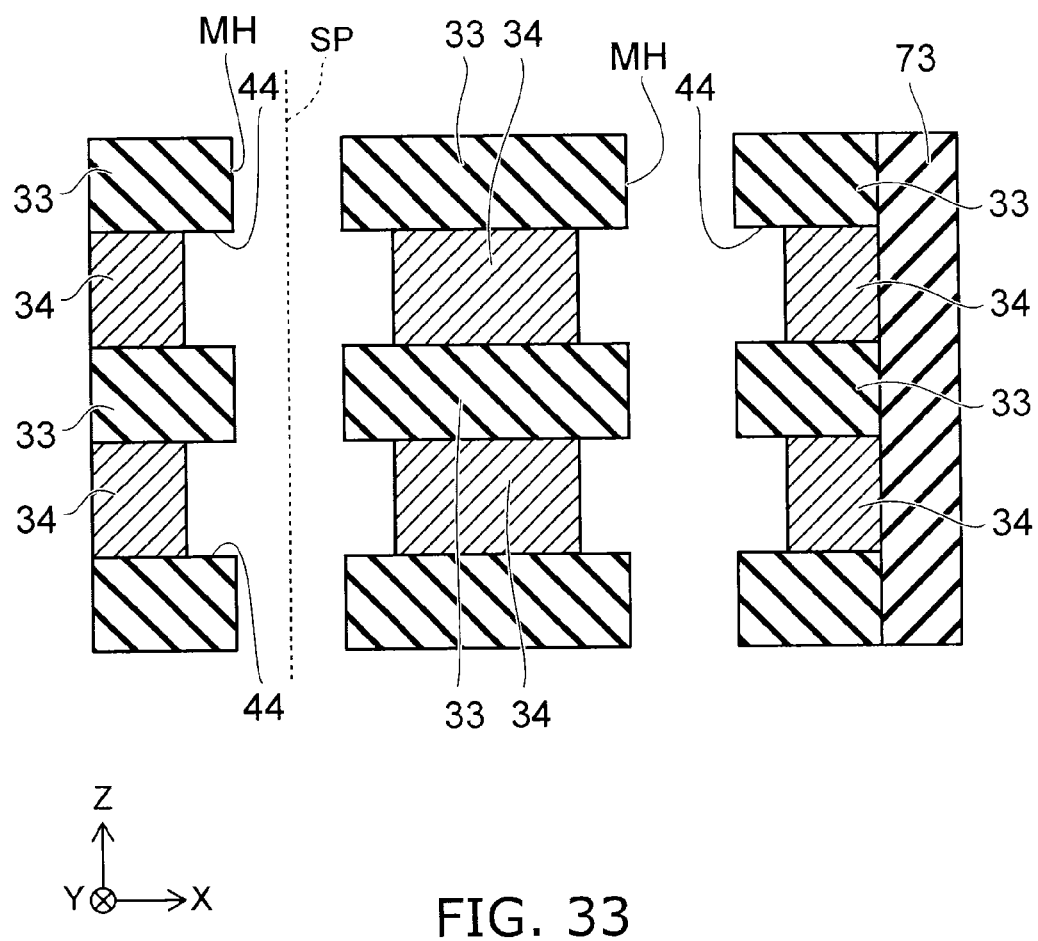
FIG. 33 is a cross-sectional view showing an example of the method of manufacturing the semiconductor memory device according to the second embodiment.
Figure 35:
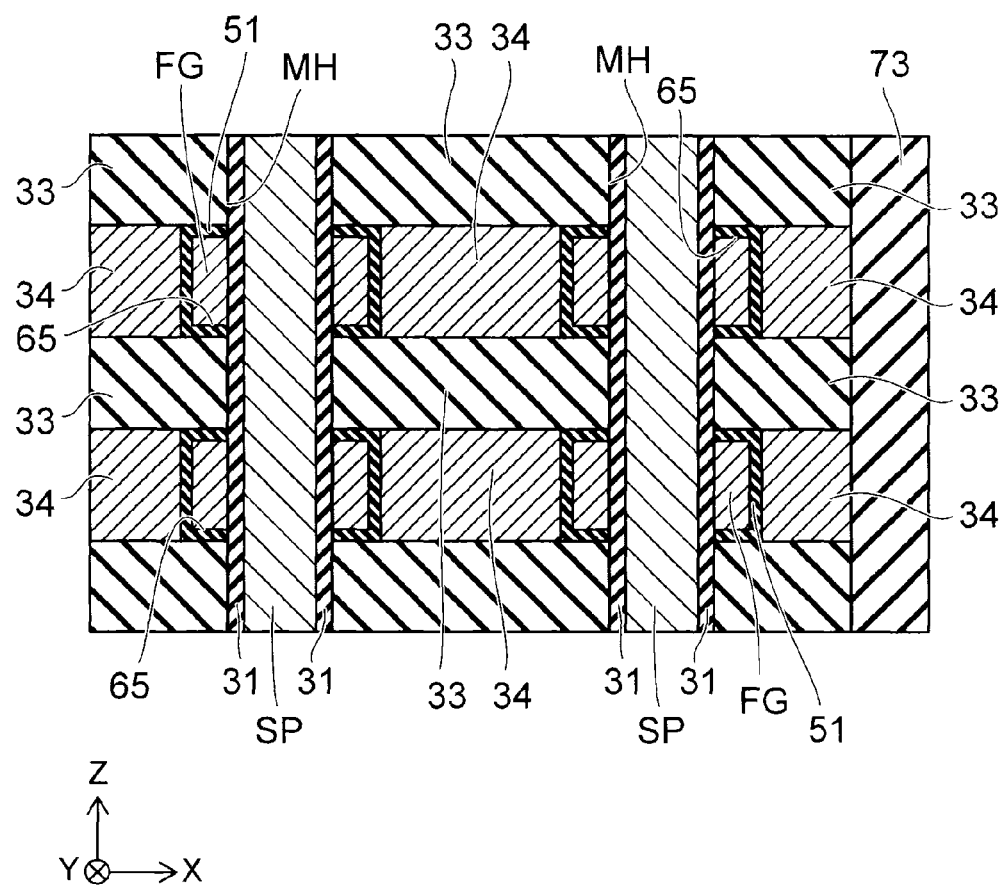
FIG. 35 is a cross-sectional view showing an example of the method of manufacturing the semiconductor memory device according to the second embodiment.

FIGS. 33 and 35 are cross-sectional views showing the area F shown in FIG. 31.

FIGS. 32, 34, 37, and 38 are cross-sectional views along the line I-I' shown in FIG. 31.

Figure 29:
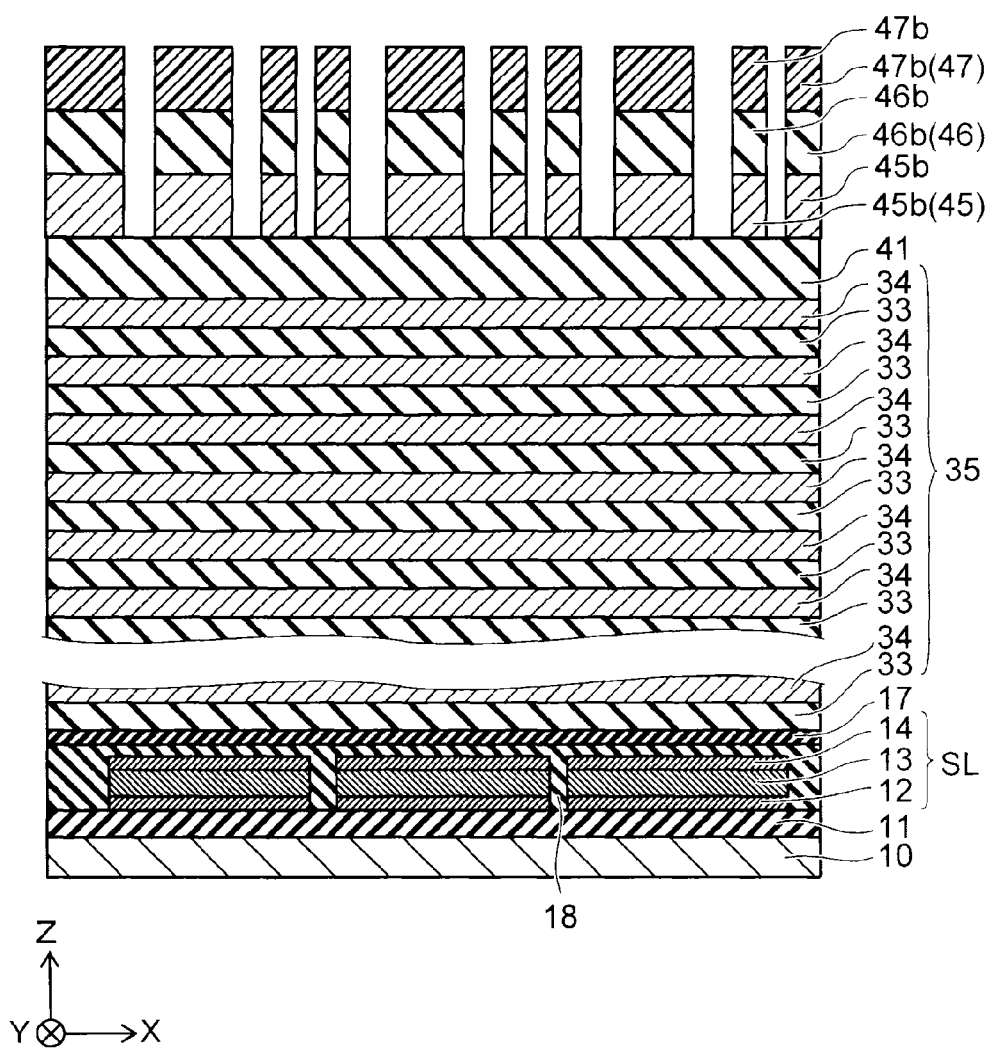
FIG. 29 is a cross-sectional view showing an example of the method of manufacturing the semiconductor memory device according to the second embodiment.

As shown in FIG. 29, silicon oxide ($SiO_2$) is deposited on the stacked body 35 to form the mask 41. The hard mask 45 is formed on the mask 41. The antireflective film 46 is formed on the hard mask 45. The resist film 47 is formed on the antireflective film 46. By exposing and then developing the resist film 47, resist patterns 47b are formed. By performing etching using the resist patterns 47b as a mask, the antireflective films 46b and the hard masks 45b are formed.

Figure 30:
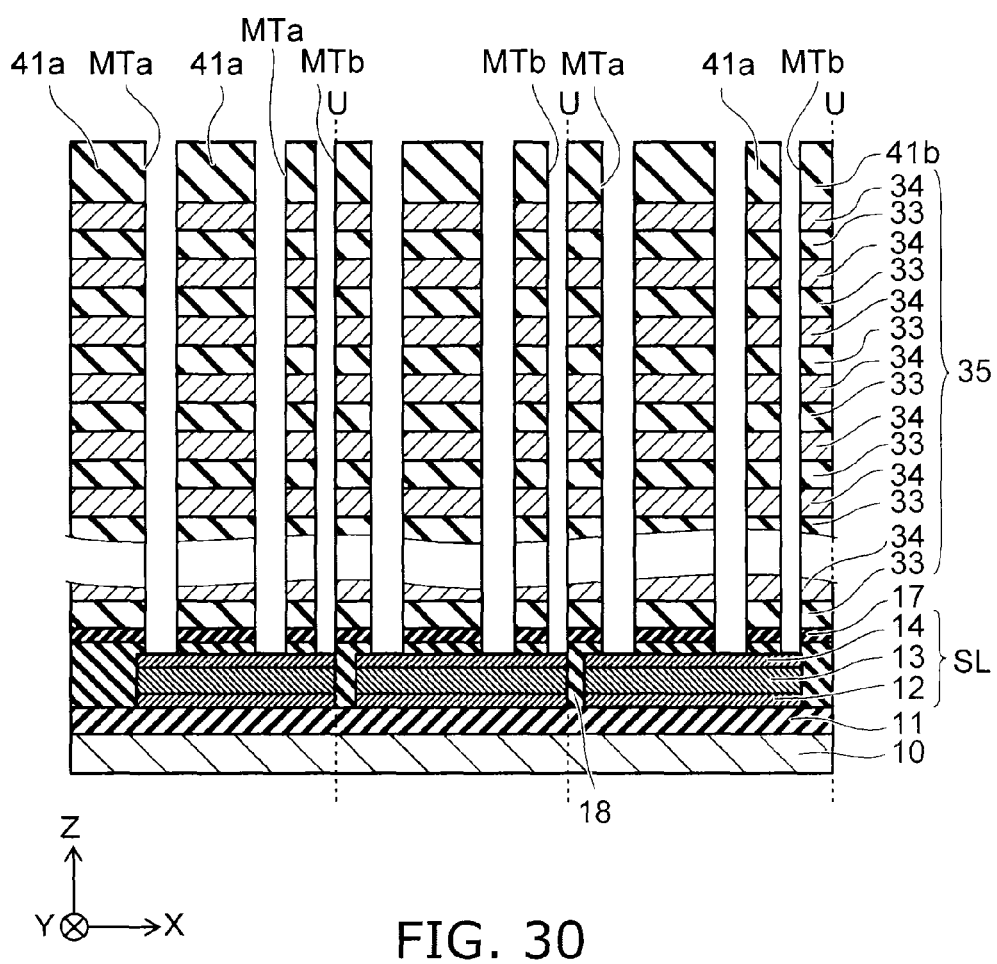
FIG. 30 is a cross-sectional view showing an example of the method of manufacturing the semiconductor memory device according to the second embodiment.

As shown in FIG. 30, by performing etching using the resist patterns 47a and so on as a mask, the masks 41b are formed. By performing etching using the masks 41b as a mask, there are formed the memory cell trenches MT each shaped like a trench penetrating the stacked body 35 and the insulating film 17 in the Z-direction to reach the source line SL. Out of the memory cell trenches MT formed along the X-direction, the memory cell trench MT the nearest to a boundary U of the block BK is referred to as a memory cell trench MTb. The memory cell trenches other than the memory cell trench MTb are referred to as memory cell trenches MTa.

As shown in FIG. 31, the memory cell trenches MTb are filled with an insulating material to form insulating members 73. The memory cell trenches MTa are filled with an insulating material to form insulating members 81.

Figure 32:
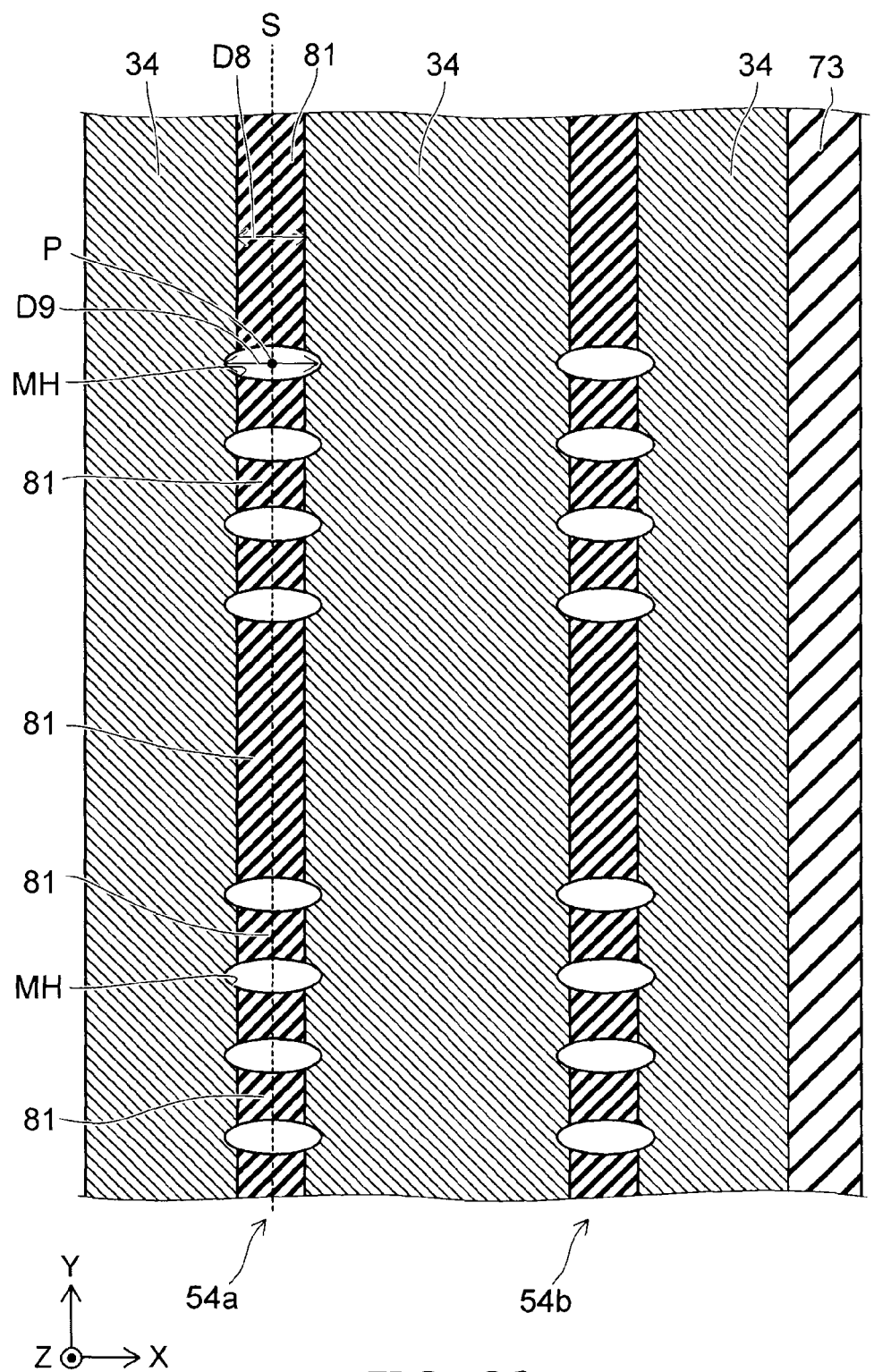
FIG. 32 is a cross-sectional view showing an example of the method of manufacturing the semiconductor memory device according to the second embodiment.

As shown in FIG. 32, memory holes MH penetrating the insulating member 81 in the Z-direction are formed. On this occasion, the memory holes MH are formed so that a central surface S of the insulating member 81 and the central axis P of the memory hole MH overlap each other. In the X-direction, the width D9 of the memory hole MH is larger than the width D8 of the insulating member 81. Thus, the insulating member 81 is divided in the Y-direction.

As shown in FIG. 33, wet etching using, for example, hot phosphoric acid ($H_3PO_4$), the chemical for removing silicon nitride, as an etchant is performed via the memory holes MH. Thus, a part of each of the filling films 34 located on the memory hole MH side is removed to form recesses 44 on the side surfaces of each of the memory holes MH.

Figure 34:
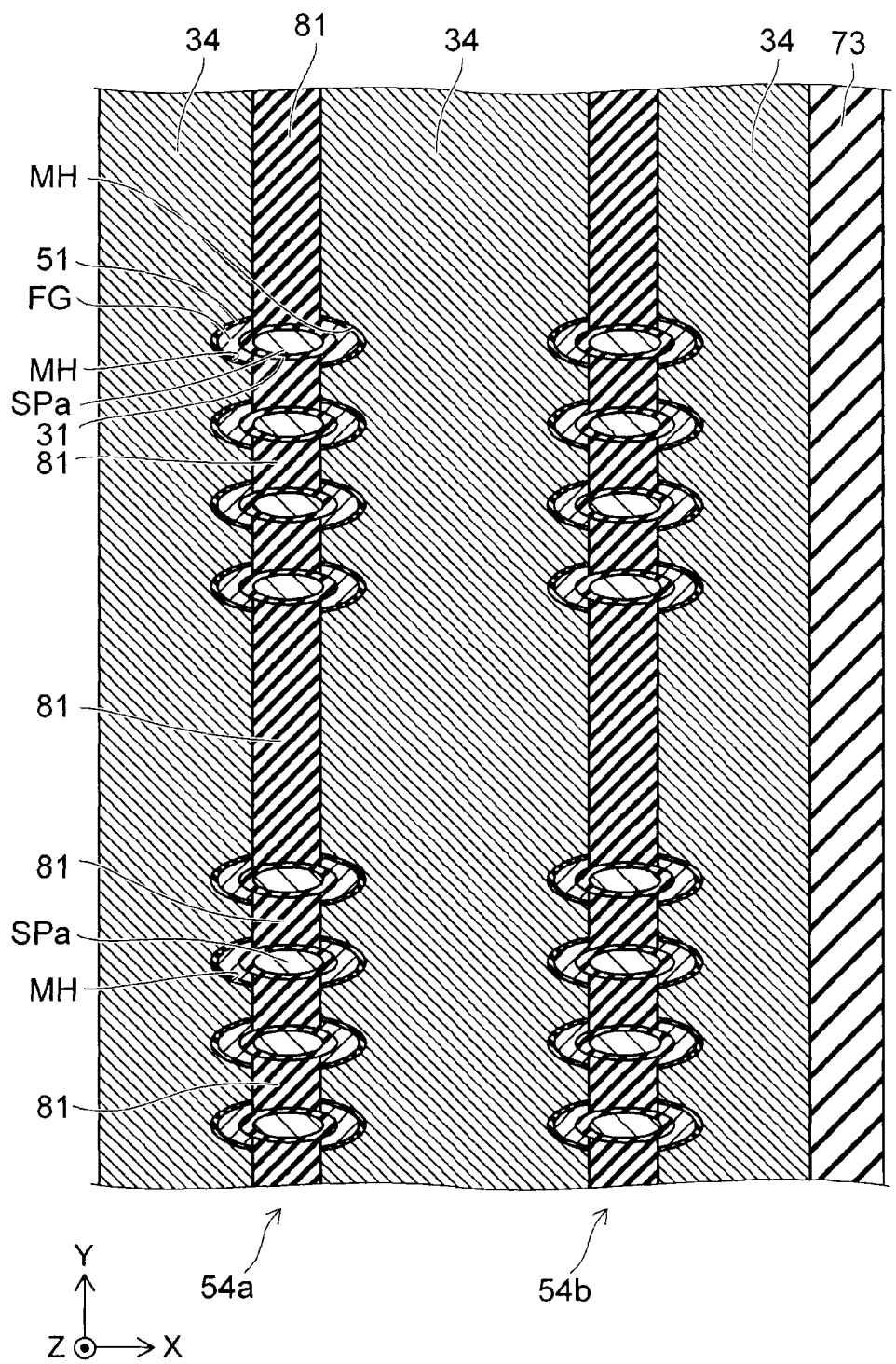
FIG. 34 is a cross-sectional view showing an example of the method of manufacturing the semiconductor memory device according to the second embodiment.

As shown in FIGS. 34 and 35, silicon nitride, ruthenium, and silicon nitride, for example, are deposited on the side surfaces of each of the memory holes MH and the inner surface of each of the recesses 44 in this order to form the block insulating films 51. Recesses 65 reflecting the recesses 44 are formed on the surface of each of the block insulating films 51. Polysilicon, for example, is deposited on the surface of each of the block insulating films 51 to form the floating gate electrodes FG. On this occasion, the recesses 65 are filled with polysilicon.

The floating gate electrodes FG disposed on the side surfaces of each of the memory holes MH are removed by performing, for example, CDE using TMY as an etchant. The block insulating films 51 disposed on the side surfaces of each of the memory holes MH are removed by performing wet etching using hot phosphoric acid as an etchant to expose the insulating films 33. Thus, the block insulating films 51 and the floating gate electrodes FG are divided into parts corresponding to the respective layers in the Z-direction. The floating gate electrodes FG are formed to have a roughly arched shape formed of a semicircle lacking a central part viewed from the Z-direction.

For example, silicon oxide is deposited on the side surfaces of each of the memory holes MH to form the tunnel insulating films 31. The memory holes MH are filled with, for example, amorphous silicon, and then the annealing treatment is performed to crystallize the amorphous silicon to thereby form the silicon pillars SP.

Figure 36:
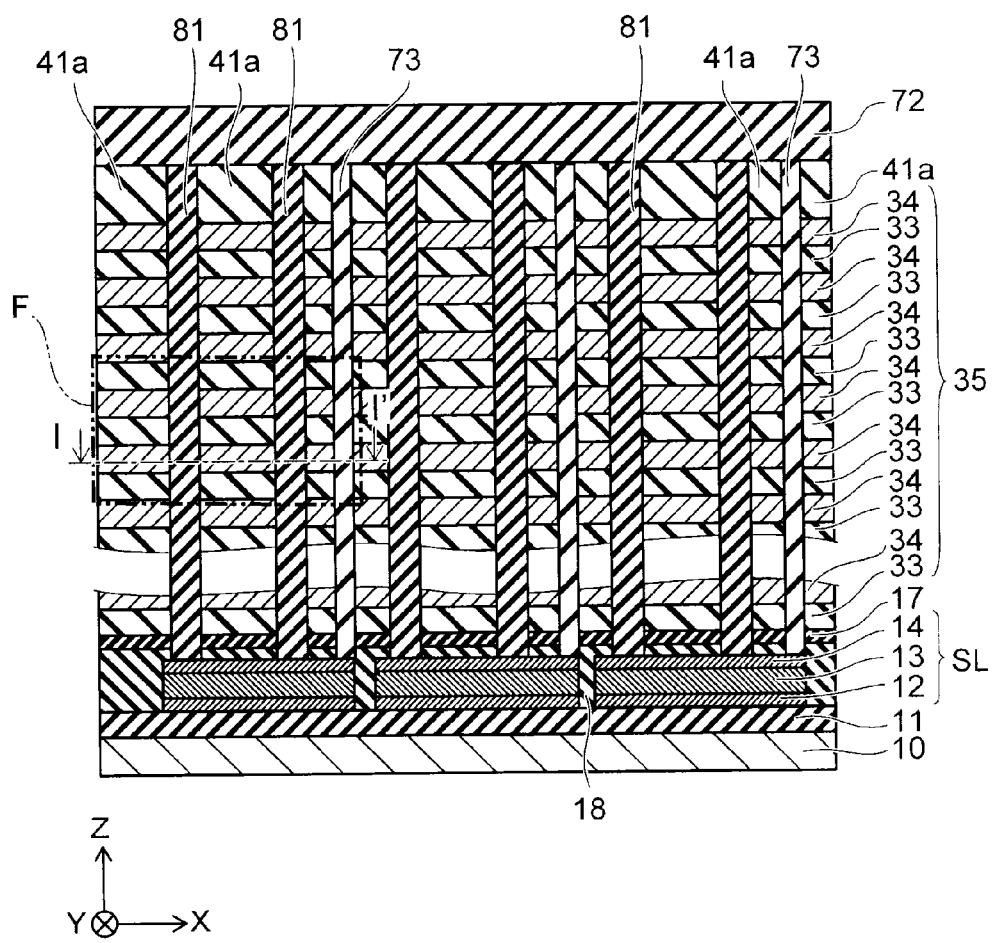
FIG. 36 is a cross-sectional view showing an example of the method of manufacturing the semiconductor memory device according to the second embodiment.

As shown in FIG. 36, the hard mask 72 is formed on the masks 41a. Opening sections of the hard mask 72 each have a rectangular shape having a longitudinal direction parallel to the X-direction, and are disposed in the areas immediately above the insulating members 81 in order to divide the insulating members 81 along the Y-direction. The opening sections of the hard mask 72 are not disposed in the areas immediately above the parts where the silicon pillars SP, the tunnel insulating films 31, the floating gate electrodes FG, and the block insulating films 51 are formed.

Figure 37:
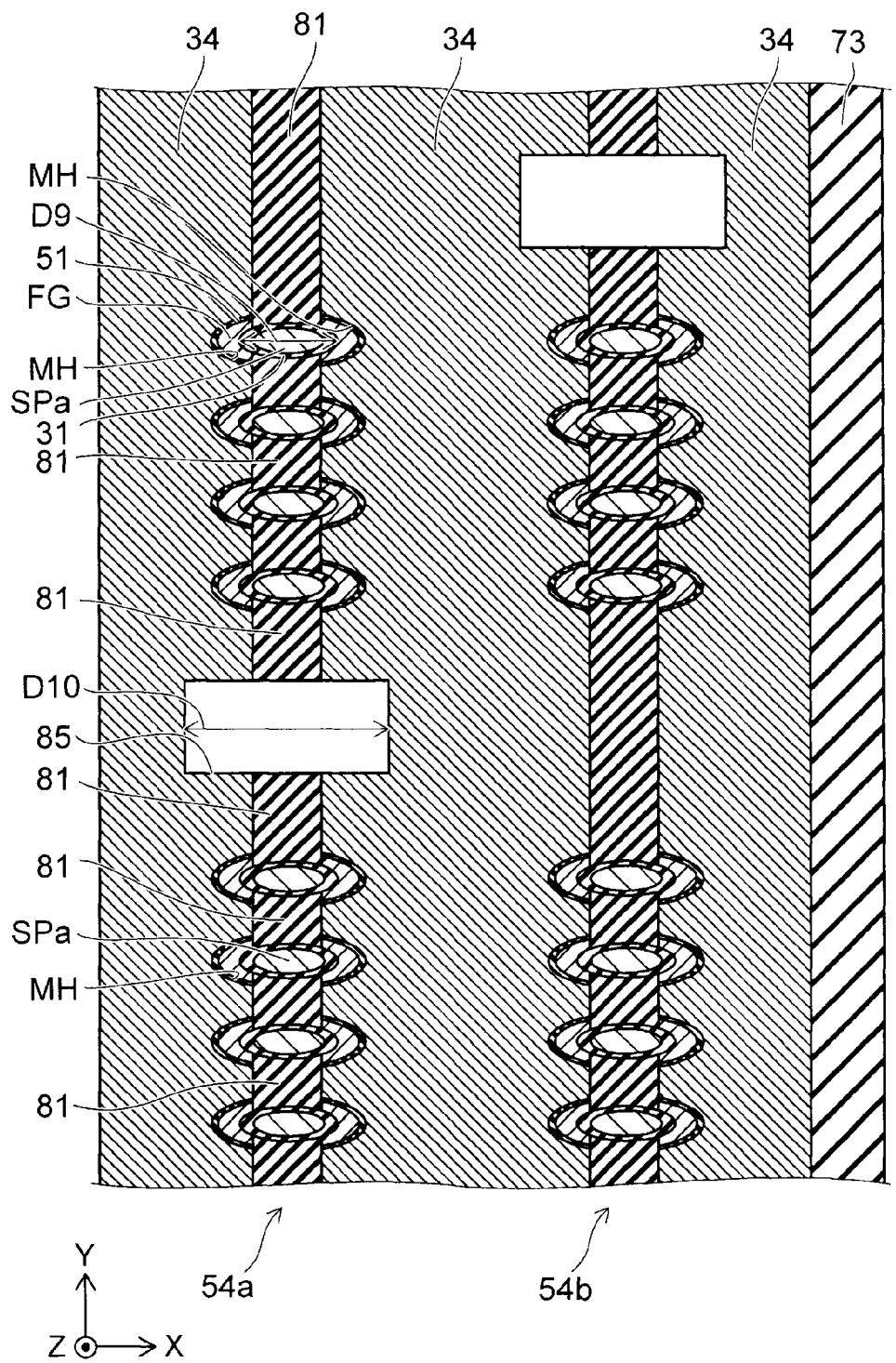
FIG. 37 is a cross-sectional view showing an example of the method of manufacturing the semiconductor memory device according to the second embodiment.

As shown in FIG. 37, for example, wet etching is performed using the hard mask 72 as a mask to remove a part of each of the insulating films 33, a part of each of the filling films 34, and a part of each of the insulating members 81. Thus, a through hole 85 is formed in an area immediately below each of the opening sections of the hard mask 72. In the X-direction, the length D10 of the through hole 85 is larger than the width D9 of the memory hole MH, and the insulating member 81 is divided by the through holes 85 in the Y-direction. The through holes 85 are not disposed in the parts where the silicon pillars SP, the tunnel insulating films 31, the floating gate electrodes FG, and the block insulating films 51 are formed.

Figure 38:
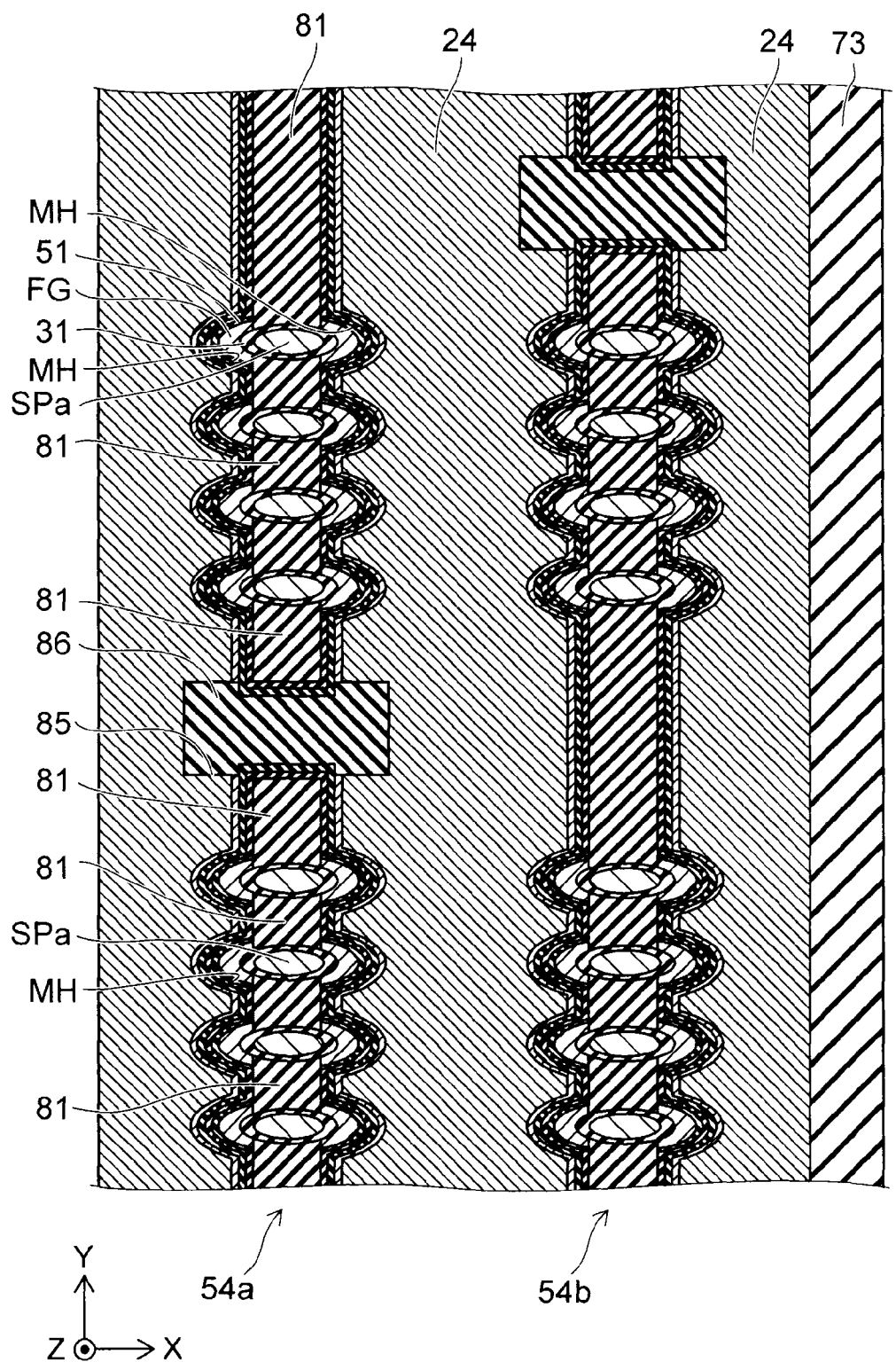
FIG. 38 is a cross-sectional view showing an example of the method of manufacturing the semiconductor memory device according to the second embodiment.

As shown in FIG. 38, wet etching using, for example, hot phosphoric acid, the chemical for removing silicon nitride, as an etchant is performed via the through holes 85 to remove the filling films 34 communicating with the through holes 85. Thus, the block insulating films 51 are exposed. The block insulating films 52 are formed on the surfaces of the respective block insulating films 51, and then the block insulating films 53 are formed on the surfaces of the respective block insulating films 52. The barrier metal films 23 are formed on the surfaces of the respective block insulating films 53, and then the electrically conductive members 24 are formed on the surfaces of the respective barrier metal films 23. The electrically conductive members 24 and the barrier metal films 23 formed on the side surfaces of the respective through holes 85 are removed to expose the block insulating films 53. The through holes 85 are filled with, for example, silicon oxide to form insulating members 86.

Figure 39:
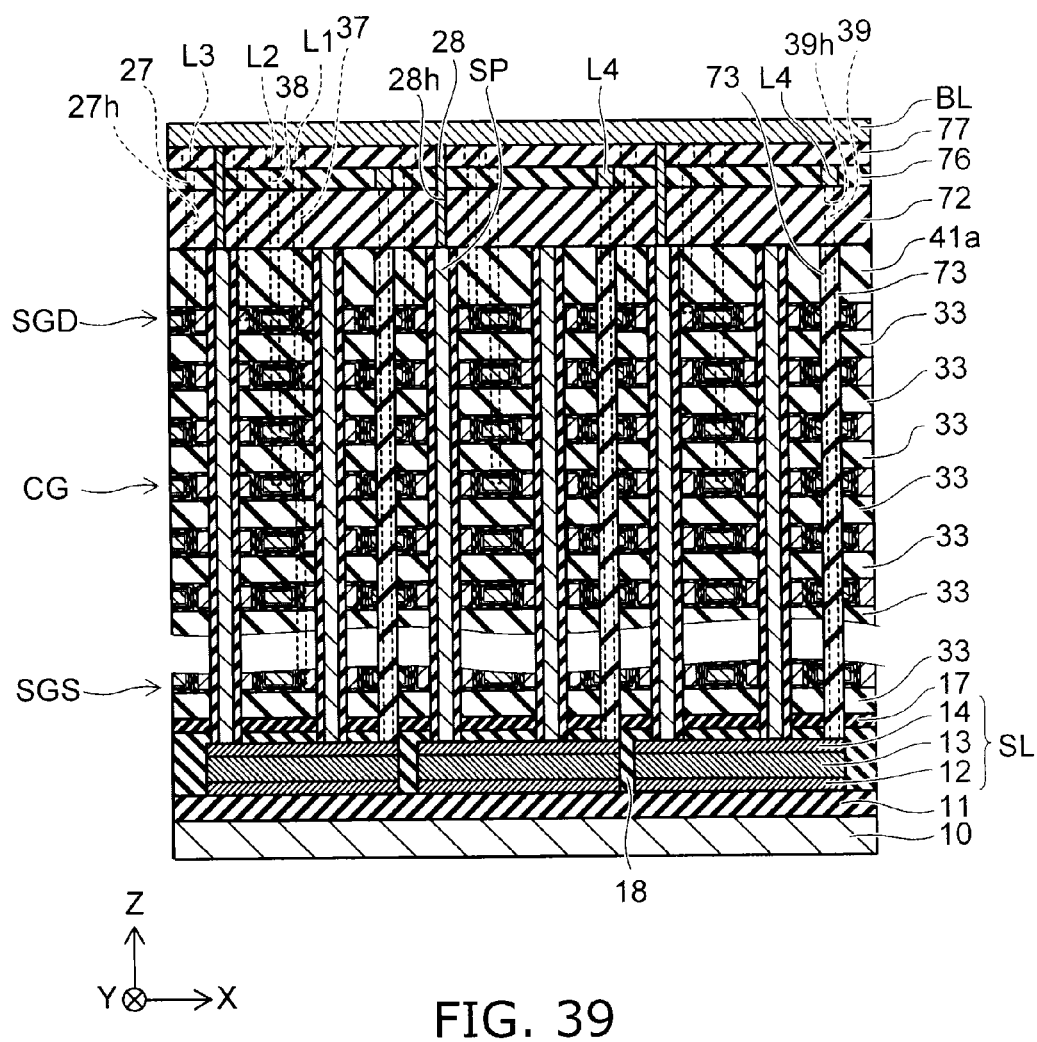
FIG. 39 is a cross-sectional view showing an example of the method of manufacturing the semiconductor memory device according to the second embodiment.

As shown in FIG. 39, in the area immediately above the insulating member 73, there is formed a contact hole 39h penetrating the hard mask 72 and the insulating member 73 in the Z-direction to reach the source line SL. The contact holes 39h are filled with, for example, tungsten to form the contacts 39. On the contacts 39, there are formed the wiring lines L4 separated in the X-direction, and extending in the Y-direction. The wiring lines L4 are each formed of, for example, tungsten. The space between the wiring lines L4 is filled with the insulating member 76 to be planarized.

The processes from the formation of the contact holes 29h (see FIG. 24) to the formation of the bit lines BL are substantially the same as those of the first embodiment described above. In such a manner as described above, the semiconductor memory device 3 according to the embodiment is manufactured.

Other configurations and advantages in the embodiment than described above are substantially the same as in the first embodiment described above.

Third Embodiment

Figure 40:
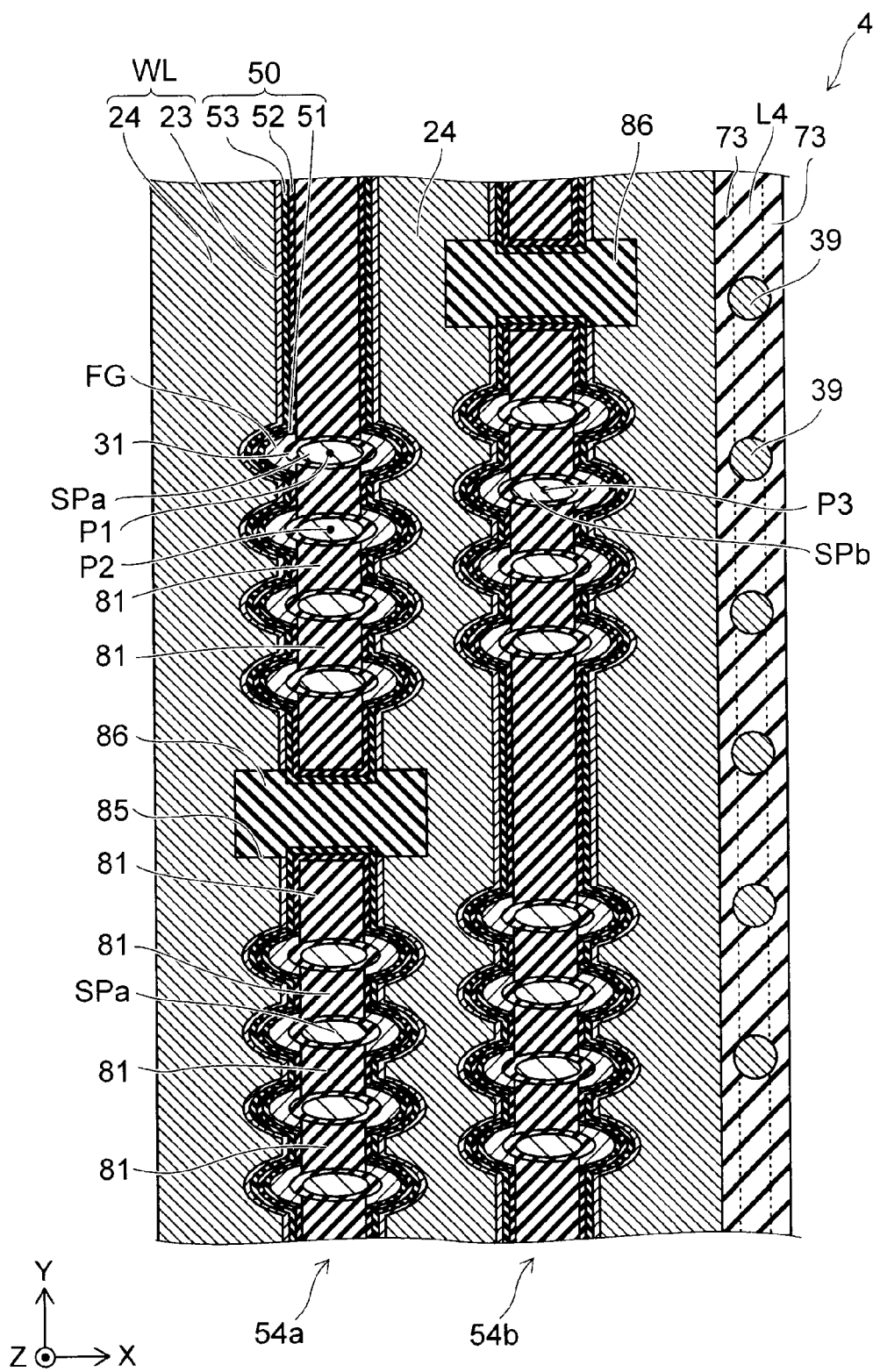
FIG. 40 is a cross-sectional view showing an example of the semiconductor memory device according to a third embodiment.

FIG. 40 is a cross-sectional view showing an example of a semiconductor memory device according to a third embodiment.

As shown in FIG. 40, the semiconductor memory device 4 according to the embodiment is different in the point that the arrangement of the silicon pillars SP is like a hound's-tooth check viewed from the Z-direction compared to the semiconductor memory device 3 (see FIG. 28) according to the second embodiment described above.

Specifically, the central axis P1 of the silicon pillar SPa in the array 54a, the central axis P2 of another silicon pillar SPa in the array 54a, and the central axis P3 of the silicon pillar SPb in the array 54b are arranged like a hound's-tooth check viewed from the Z-direction.

By arranging the silicon pillars SP like a hound's-tooth check viewed from the Z-direction, the distance between the silicon pillars SP can be shortened. Thus, the number of silicon pillars SP can be increased compared to the case in which, for example, the silicon pillars SP are arranged like a grid.

Other configurations, manufacturing methods, and advantages in the embodiment than described above are substantially the same as in the second embodiment described above.

Fourth Embodiment

Figure 41:
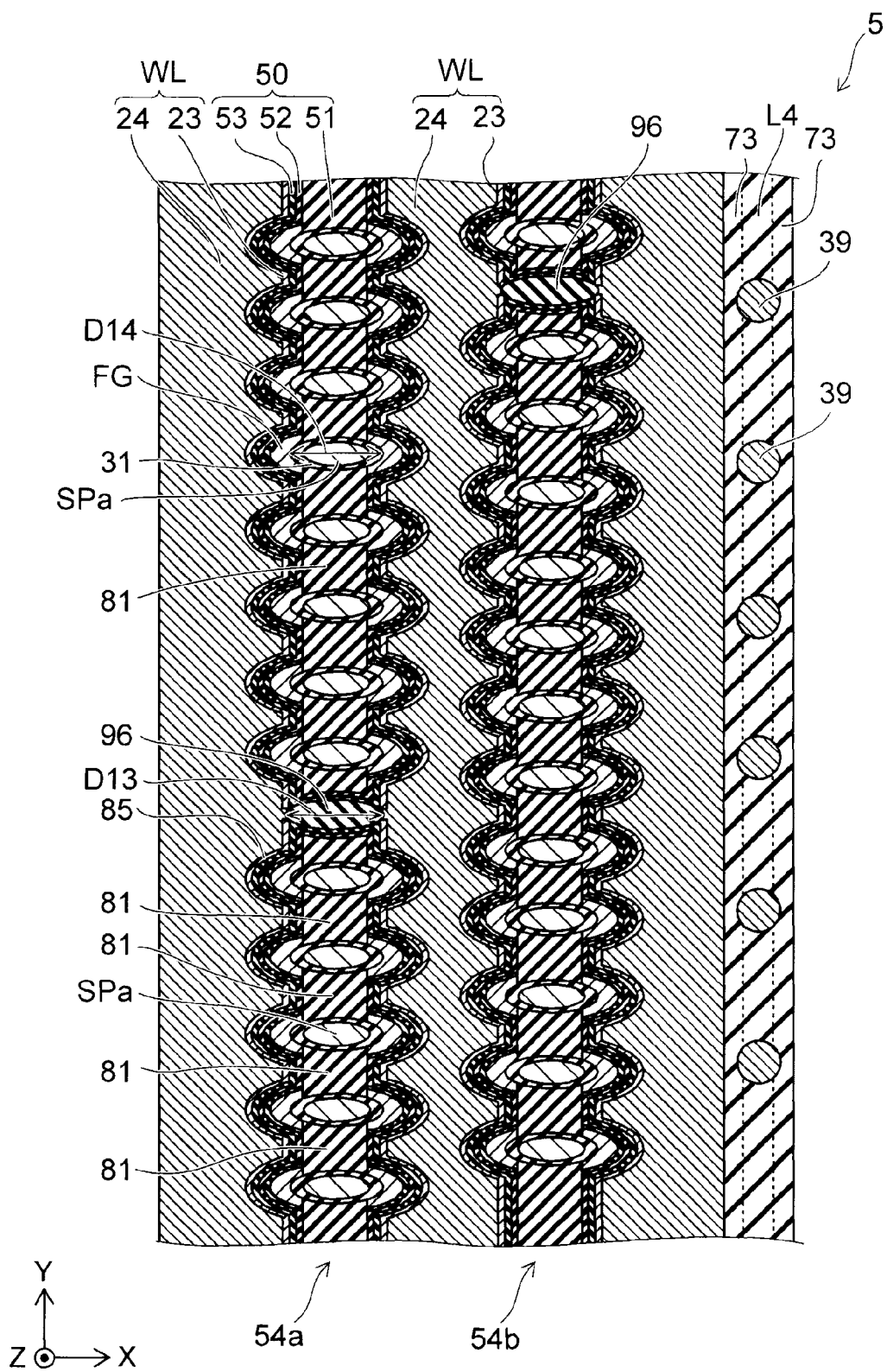
FIG. 41 is a cross-sectional view showing an example of the semiconductor memory device according to a fourth embodiment.

FIG. 41 is a cross-sectional view showing an example of a semiconductor memory device according to a fourth embodiment.

As shown in FIG. 41, the semiconductor memory device 5 according to the embodiment is different in the points (c1) and (c2) below compared to the semiconductor memory device 4 (see FIG. 40) according to the third embodiment described above.

(c1) The shape of each of the insulating members 96 in the X-Y plane is an ellipse. In the X-direction, the width D13 of the insulating member 96 is equal to or longer than the width D14 of the silicon pillar SPa and the tunnel insulating film 31.

(c2) The silicon pillars SP and the insulating members 96 are periodically arranged in the Y-direction.

Due to the points (c1), (c2), it is possible to increase the number of the silicon pillars SP compared to the third embodiment described above.

Therefore, it is possible for the semiconductor memory device 5 according to the embodiment to incorporate a larger number of silicon pillars SP compared to the semiconductor memory device 4 according to the third embodiment.

Other configurations, manufacturing methods, and advantages in the embodiment than described above are substantially the same as in the third embodiment described above.

According to the embodiments explained hereinabove, it is possible to provide a semiconductor memory device incorporating a larger number of memory cells to thereby achieve high integration, and a method of manufacturing the semiconductor memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
a first array extending in a first direction;
a second array extending in the first direction and being arranged with the first array in a second direction crossing the first direction; and
a second electrode film provided between the first array and the second array, the second electrode film extending in the first direction,
each of the first array and the second array including
a first structure,
a second structure arranged in the first direction,
a fourth insulating film provided between the first structure and the second structure, and
a third insulating film provided between the first structure and the second electrode film, provided also between the first structure and the fourth insulating film,
a fifth insulating film provided between the second structure and the second electrode film, provided also between the second structure and the fourth insulating film, and
the first structure including
a semiconductor pillar extending in a third direction crossing the first direction and the second direction,
in the second direction of the first structure, a first insulating film provided between the semiconductor pillar of the first structure and the third insulating film,
in the second direction of the first structure, a first electrode film provided between the first insulating film of the first structure and the third insulating film, and
in the first direction of the first structure, a second insulating film provided between the semiconductor pillar of the first structure and the third insulating film,
the second structure including
a semiconductor pillar extending in the third direction,
in the second direction of the second structure, a first insulating film provided between the semiconductor pillar of the second structure and the fifth insulating film,
in the second direction of the second structure, a first electrode film provided between the first insulating film of the second structure and the fifth insulating film, and
in the first direction of the second structure, a second insulating film provided between the semiconductor pillar of the second structure and the fifth insulating film.

2. The device according to claim 1, wherein
in the second direction, a width of the fourth insulating film is larger than a width of the second insulating film.

3. The device according to claim 1, wherein
a number of the fourth insulating films in the first array and the second array is smaller than a number of the semiconductor pillars.

4. The device according to claim 1, wherein
in the first direction, a position of the semiconductor pillar in the first array and a position of the semiconductor pillar in the second array are different from each other.

5. The device according to claim 1, wherein
in the first direction, a position of the fourth insulating film in the first array and a position of the fourth insulating film in the second array are different from each other.

6. The device according to claim 1, wherein
the width of the fourth insulating film of the second direction is one of equal to and larger than a width of the semiconductor pillar and the first insulating film of the second direction.

7. The device according to claim 1, wherein
in a plane including the first direction and the second direction, a cross-sectional shape of the fourth insulating film is an ellipse.

8. The device according to claim 1, further comprising:
a sixth insulating member provided on a position in the second direction from the second array, including a length in the first direction along the second array and a width in the second direction, and extending in the third direction; and
an electrically conductive member piercing the sixth insulating member, and extending in the third direction.

9. The device according to claim 8, further comprising:
a second electrode film connected to an end of the semiconductor pillar and an end of the electrically conductive member.

10. The device according to claim 1, wherein
the first insulating film is provided in a periphery of the semiconductor pillar.

11. The device according to claim 10, wherein
in a plane including the first direction and the second direction, a cross-sectional shape of the semiconductor pillar is an ellipse.

12. The device according to claim 10, wherein
in the second direction, a length of a first member including the semiconductor pillar and the first insulating film is larger than a length of the second insulating film.

13. The device according to claim 12, wherein
in the second direction, the length of first member is smaller than a length of the fourth insulating film.

14. A method of manufacturing a semiconductor memory device, comprising:
forming a stacked body by alternately stacking first insulating films and filling films in a first direction;
forming a trench shaped like a trench penetrating the stacked body in the first direction, and provided in a second direction different from the first direction;

forming a first recess by removing a part of the filling film via the trench, the part being located on the trench side;

forming a second insulating film on an inner surface of the first recess;

forming a first electrode film in the first recess;

forming a third insulating film on a surface of the first electrode film;

forming a semiconductor body by filling the trench with a semiconductor material;

forming a plurality of semiconductor pillars by forming a first insulating member penetrating the semiconductor body in the first direction to divide the semiconductor body in the second direction, and dividing the third insulating film, the first electrode film, and the second insulating film in the second direction for each of the semiconductor pillars;

forming a through hole dividing the first insulating member in the second direction;

exposing a surface of the second insulating film by forming a hollow section by removing the filling film via the through hole;

forming a second electrode film in the hollow section via the through hole; and forming the second insulating member by removing the second electrode film in the through hole and filling the through hole with an insulating material.

15. The method according to claim 14, further comprising:

forming a fourth insulating film on an inner surface of the hollow section before the forming the second insulating film.

16. A method of manufacturing a semiconductor memory device, comprising:

forming a stacked body by alternately stacking first insulating films and filling films in a first direction;

forming a trench shaped like a trench penetrating the stacked body in the first direction, and provided in a second direction different from the first direction;

forming a first insulating member by filling the trench with an insulating material;

forming a memory hole penetrating the first insulating member in the first direction, and dividing the first insulating member in the second direction;

forming a first recess by removing a part of the filling film via the memory hole, the part being located on the memory hole side;

forming a second insulating film on an inner surface of the first recess;

forming a first electrode film in the first recess;

forming a third insulating film on a surface of the first electrode film;

forming a semiconductor pillar by filling the memory hole with a semiconductor material;

forming a through hole dividing the first insulating member in the second direction;

exposing a surface of the second insulating film by forming a hollow section by removing the filling film via the through hole;

forming a second electrode film in the hollow section via the through hole;

forming the second insulating member by removing the second electrode film in the through hole and filling the through hole with an insulating material.

17. The method according to claim 16, further comprising:

forming a fourth insulating film on an inner surface of the hollow section before the forming the second insulating film.

* * * * *